United States Patent
Chang et al.

(10) Patent No.: US 10,269,793 B2
(45) Date of Patent: Apr. 23, 2019

(54) SOURCE/DRAIN REGIONS IN FIN FIELD EFFECT TRANSISTORS (FINFETS) AND METHODS OF FORMING SAME

(71) Applicant: Taiwan Semiconductor Manufacturing Company, Ltd., Hsin-Chu (TW)

(72) Inventors: Che-Cheng Chang, New Taipei (TW); Chih-Han Lin, Hsin-Chu (TW); Horng-Huei Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 15/340,783

(22) Filed: Nov. 1, 2016

(65) Prior Publication Data
US 2017/0317078 A1 Nov. 2, 2017

Related U.S. Application Data

(60) Provisional application No. 62/329,008, filed on Apr. 28, 2016.

(51) Int. Cl.
| | |
|---|---|
| *H01L 27/08* | (2006.01) |
| *H01L 27/088* | (2006.01) |
| *H01L 21/306* | (2006.01) |
| *H01L 21/8234* | (2006.01) |
| *H01L 29/06* | (2006.01) |
| *H01L 29/08* | (2006.01) |
| *H01L 29/66* | (2006.01) |

(52) U.S. Cl.
CPC .... *H01L 27/0886* (2013.01); *H01L 21/30608* (2013.01); *H01L 21/823418* (2013.01); *H01L 21/823431* (2013.01); *H01L 21/823437* (2013.01); *H01L 29/0649* (2013.01); *H01L 29/0847* (2013.01); *H01L 29/66545* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |

(Continued)

FOREIGN PATENT DOCUMENTS

TW 201535746 A 9/2015

*Primary Examiner* — Evren Seven
(74) *Attorney, Agent, or Firm* — Slater Matsil, LLP

(57) ABSTRACT

An embodiment method includes forming first dummy gate stack and a second dummy gate stack over a semiconductor fin. A portion of the semiconductor fin is exposed by an opening between the first dummy gate stack and the second dummy gate stack. The method further includes etching the portion of the semiconductor fin to extend the opening into the semiconductor fin. A material of the semiconductor fin encircles the opening in a top-down view of the semiconductor fin. The method further includes epitaxially growing a source/drain region in the opening on the portion of the semiconductor fin.

20 Claims, 21 Drawing Sheets

(56) References Cited

U.S. PATENT DOCUMENTS

| | | | |
|---|---|---|---|
| 9,076,869 B1* | 7/2015 | Hu | H01L 29/7848 |
| 9,640,633 B1* | 5/2017 | Greene | H01L 29/66545 |
| 2011/0073952 A1* | 3/2011 | Kwok | H01L 29/045 |
| | | | 257/368 |
| 2014/0282326 A1 | 9/2014 | Chen et al. | |
| 2015/0262823 A1 | 9/2015 | Hung et al. | |
| 2015/0357472 A1* | 12/2015 | Huang | H01L 29/7851 |
| | | | 257/20 |
| 2015/0372144 A1* | 12/2015 | Fang | H01L 29/7851 |
| | | | 257/192 |
| 2016/0149036 A1* | 5/2016 | Huang | H01L 29/7848 |
| | | | 257/401 |
| 2017/0207126 A1* | 7/2017 | Ching | H01L 21/823431 |
| 2018/0151563 A1* | 5/2018 | Chang | H01L 29/41791 |
| 2018/0151701 A1* | 5/2018 | Chen | H01L 21/0206 |

* cited by examiner

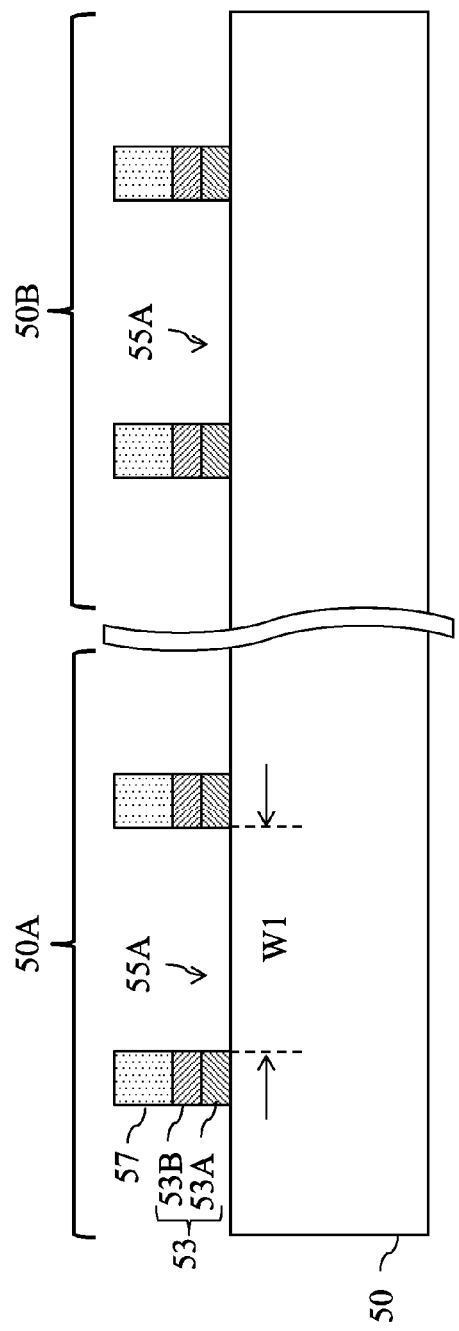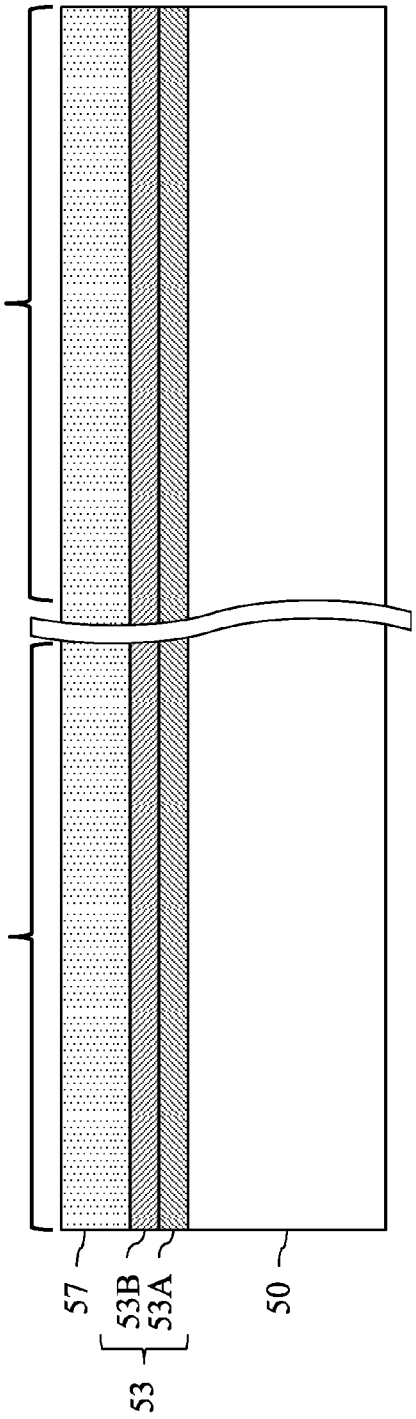
Figure 3A
Figure 3B

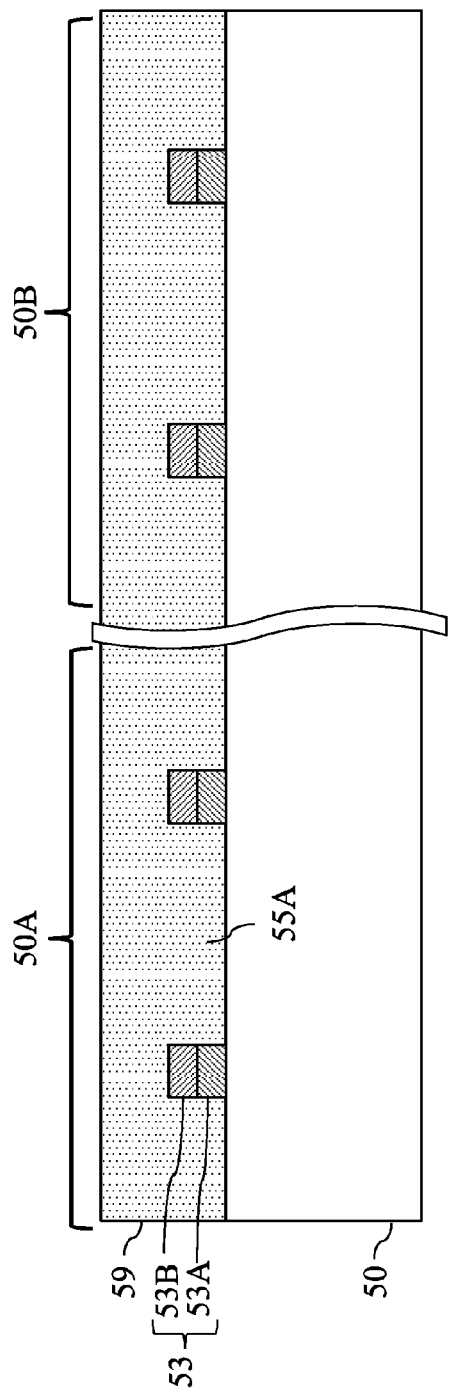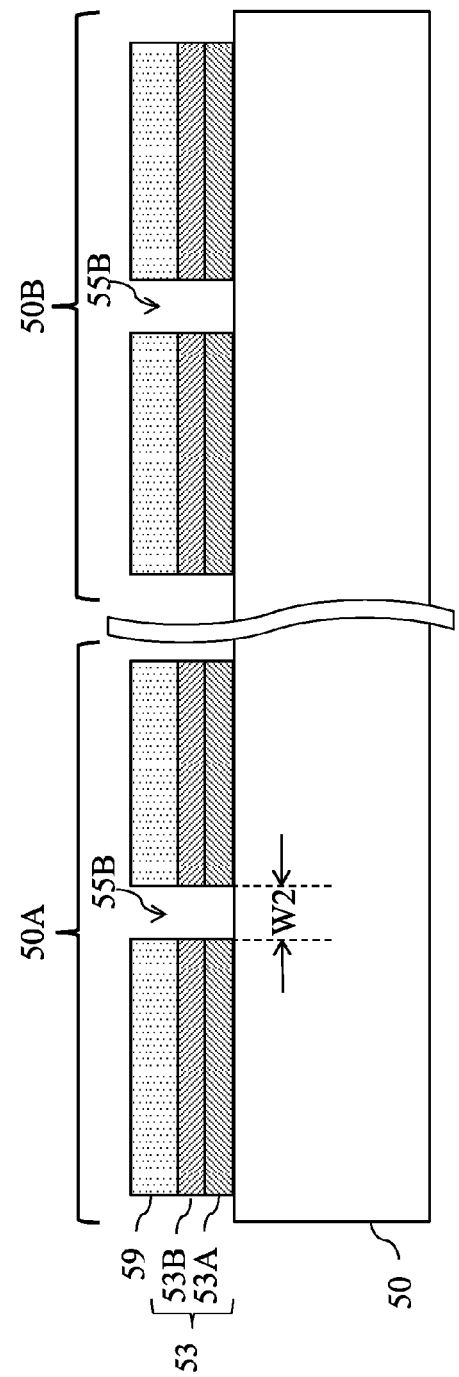

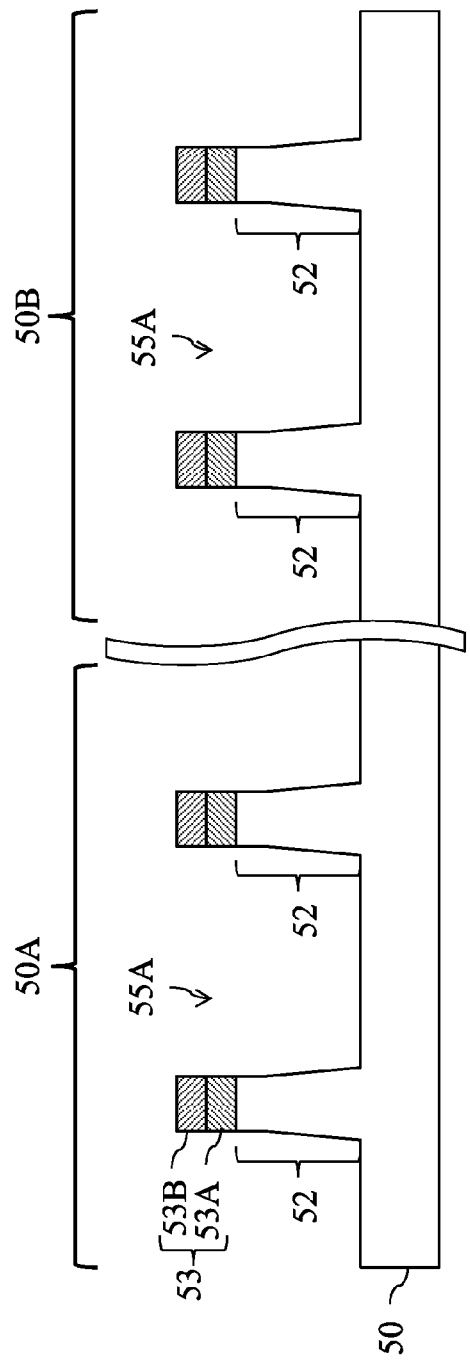
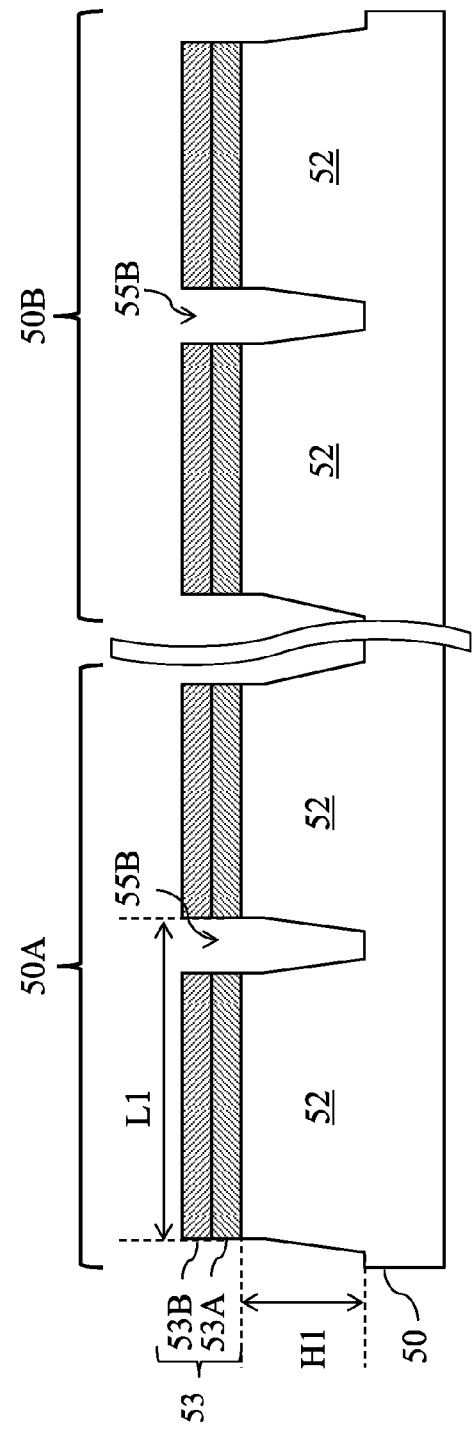

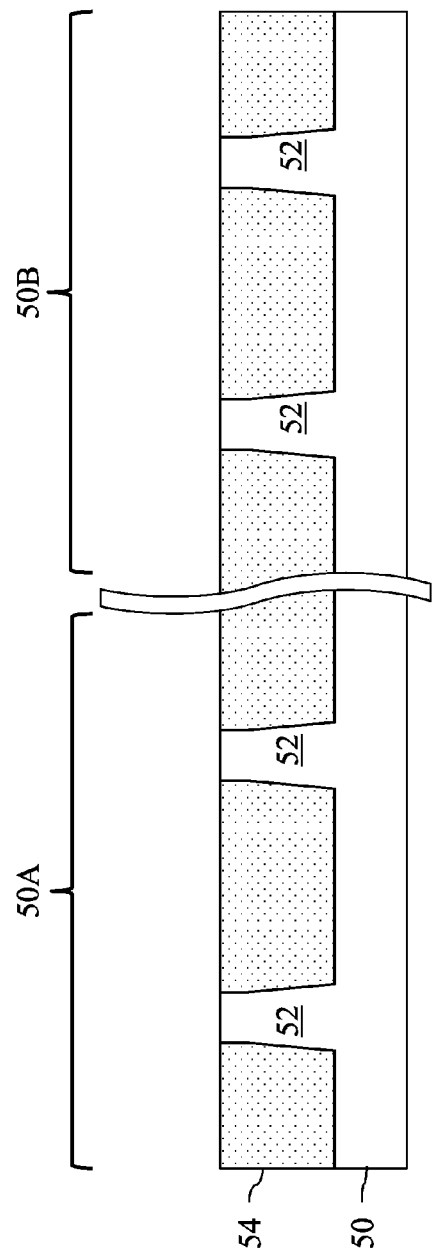
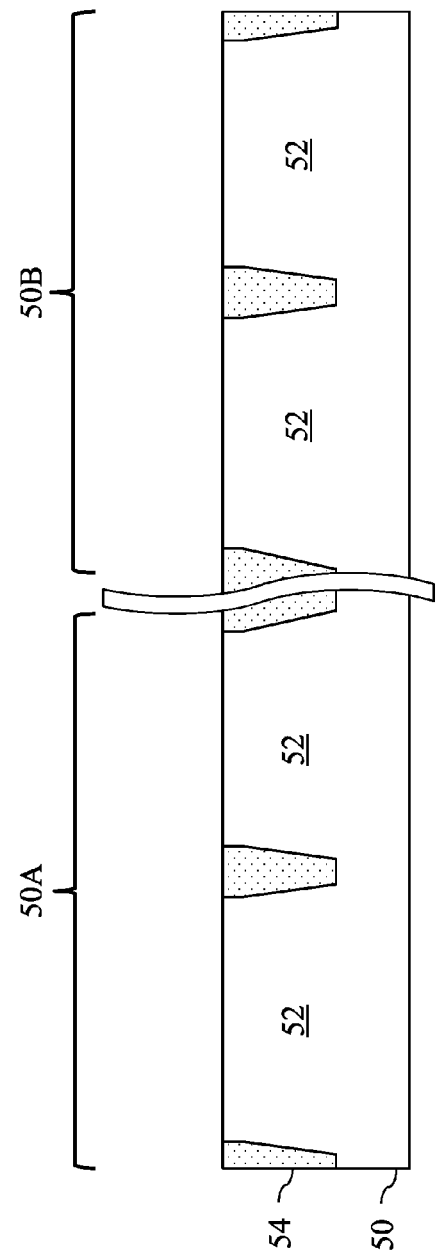
Figure 8A
Figure 8B

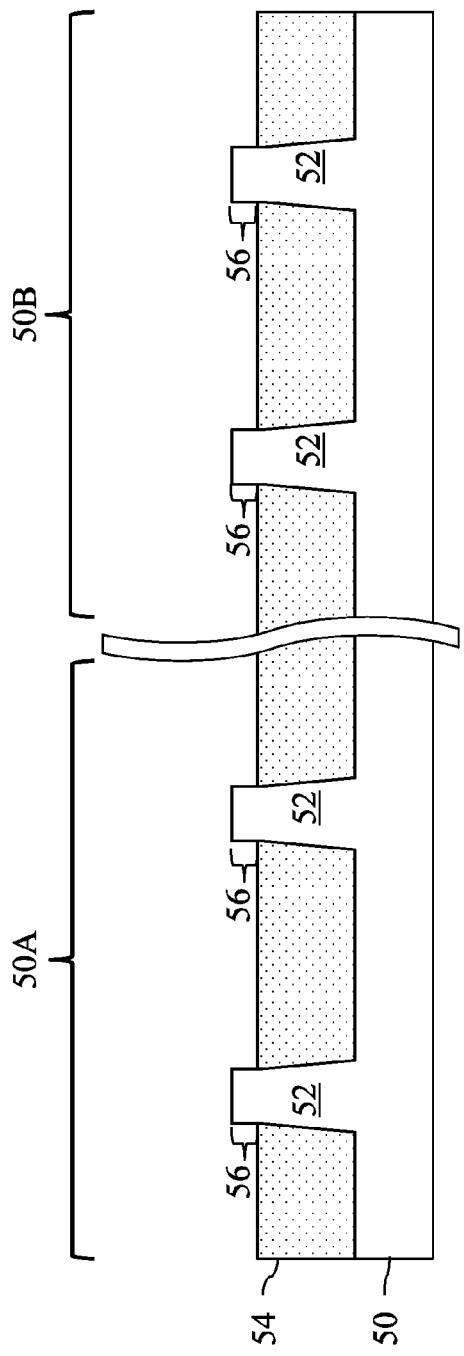
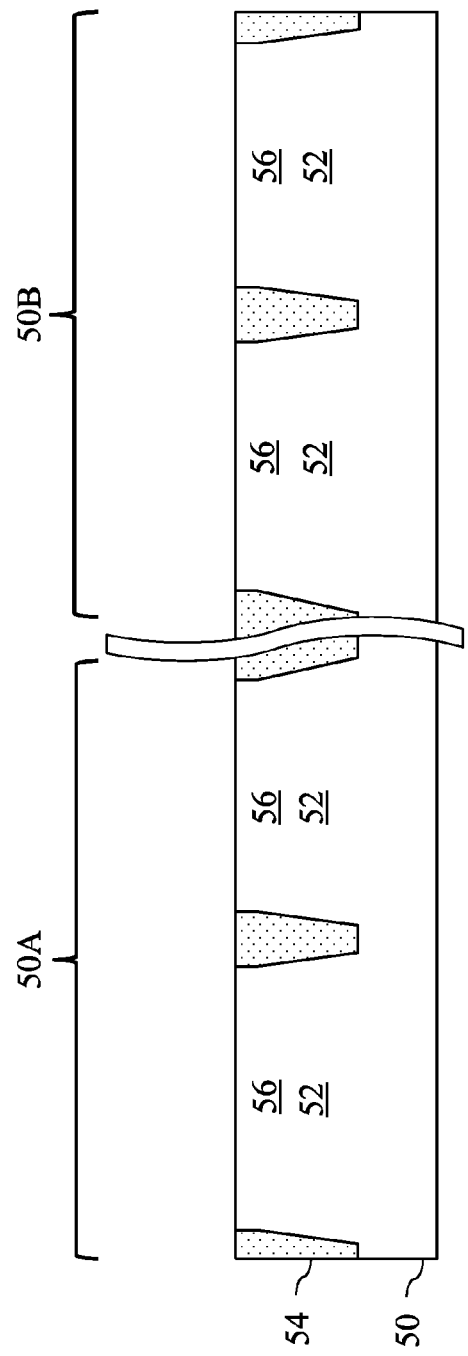

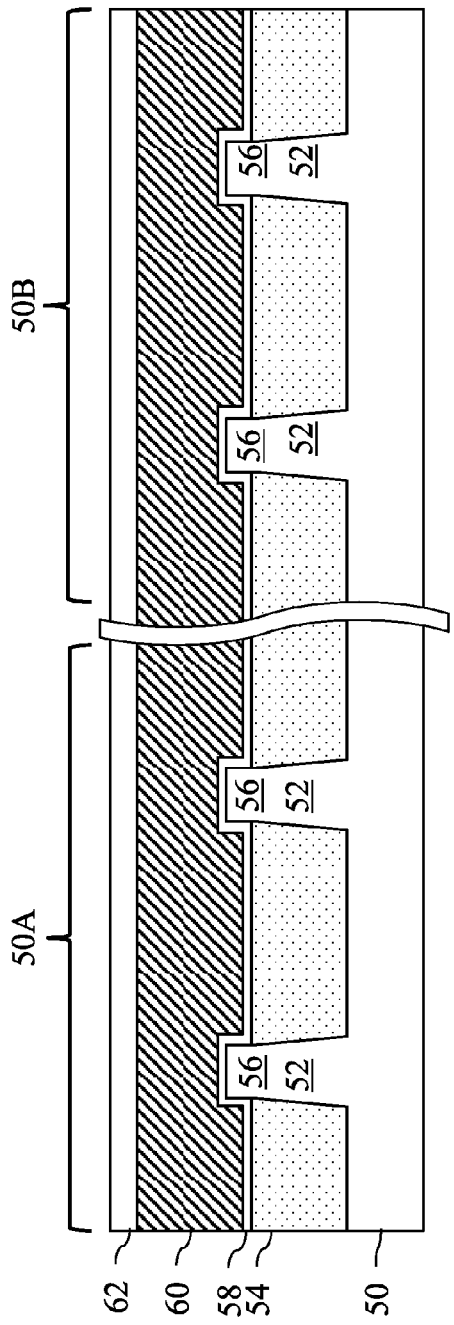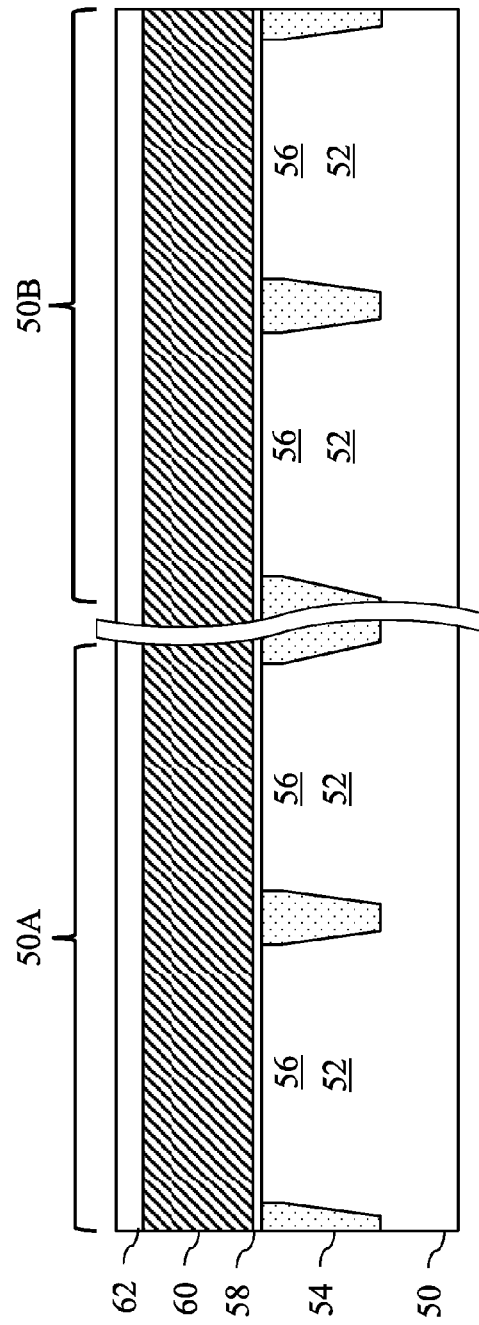

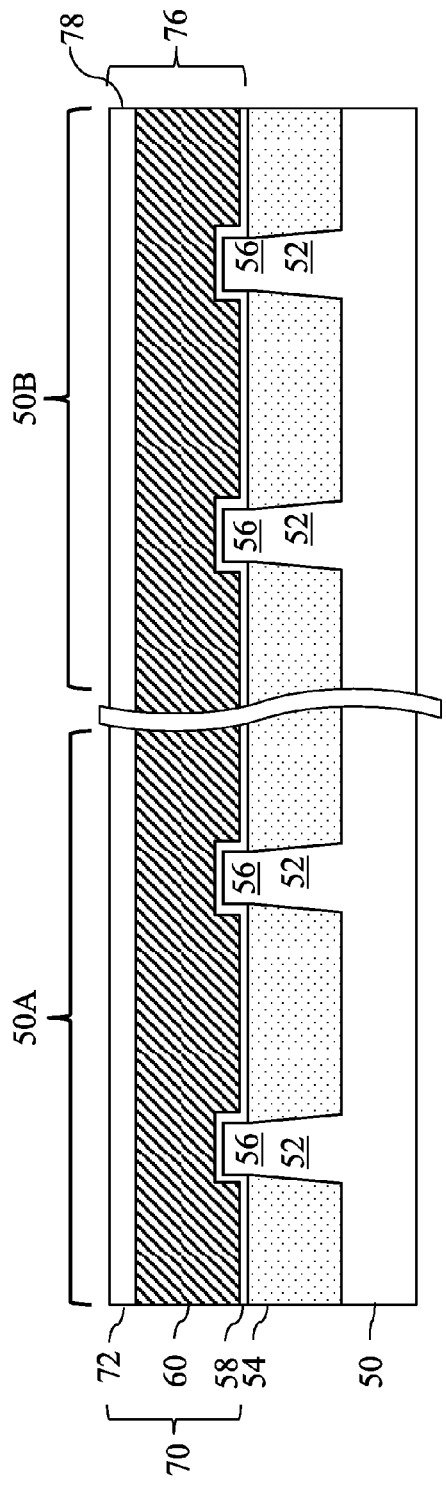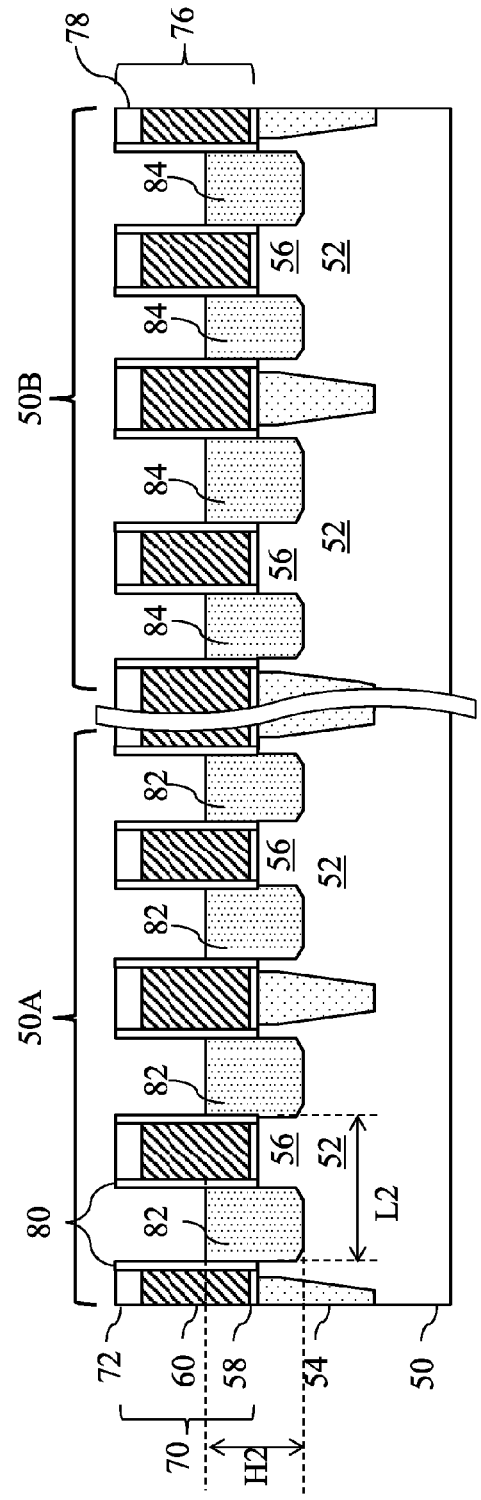
Figure 15A
Figure 15B

SOURCE/DRAIN REGIONS IN FIN FIELD EFFECT TRANSISTORS (FINFETS) AND METHODS OF FORMING SAME

PRIORITY CLAIM AND CROSS-REFERENCE

This application claims the benefits of U.S. Provisional Application Ser. No. 62/329,008, filed on Apr. 28, 2016, which application is hereby incorporated herein by reference in its entirety.

BACKGROUND

With the increasing down-scaling of integrated circuits (IC) and increasingly demanding requirements to the speed of ICs, transistors need to have higher drive currents with increasingly smaller dimensions. Fin field-effect transistors (FinFET) were thus developed. In a typical FinFET, a vertical fin structure is formed over a substrate. This vertical fin structure is used to form source/drain regions in the lateral direction and a channel region in the fin. A gate is formed over the channel region of the fin in the vertical direction forming a FinFET. Subsequently, an inter-layer dielectric (ILD) and a plurality of interconnect layers may be formed over the finFET.

Low-power and high-speed circuits are desired in current electronic applications such as smart phones, PDAs, notebooks, and so on. Compared to traditional substrate/fin materials (e.g., silicon), other semiconductor materials (e.g., germanium, silicon germanium, or other group III/group IV/group V elements) has higher mobility and lower effective mass, which benefits the drive current of Field-Effect-Transistors (FETs). Therefore, these other semiconductor materials are promising materials for the next-generation of FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5A, 5B, 6, 7A, 7B, 8A, 8B, 9A, 9B, 10A, 10B, 11A, 11B, 12, 13A, 13B, 14A, 14B, 15A, and 15B illustrate cross-sectional and top-down views of various intermediary stages of manufacturing a semiconductor device according to some embodiments.

DETAILED DESCRIPTION

Figure 1:
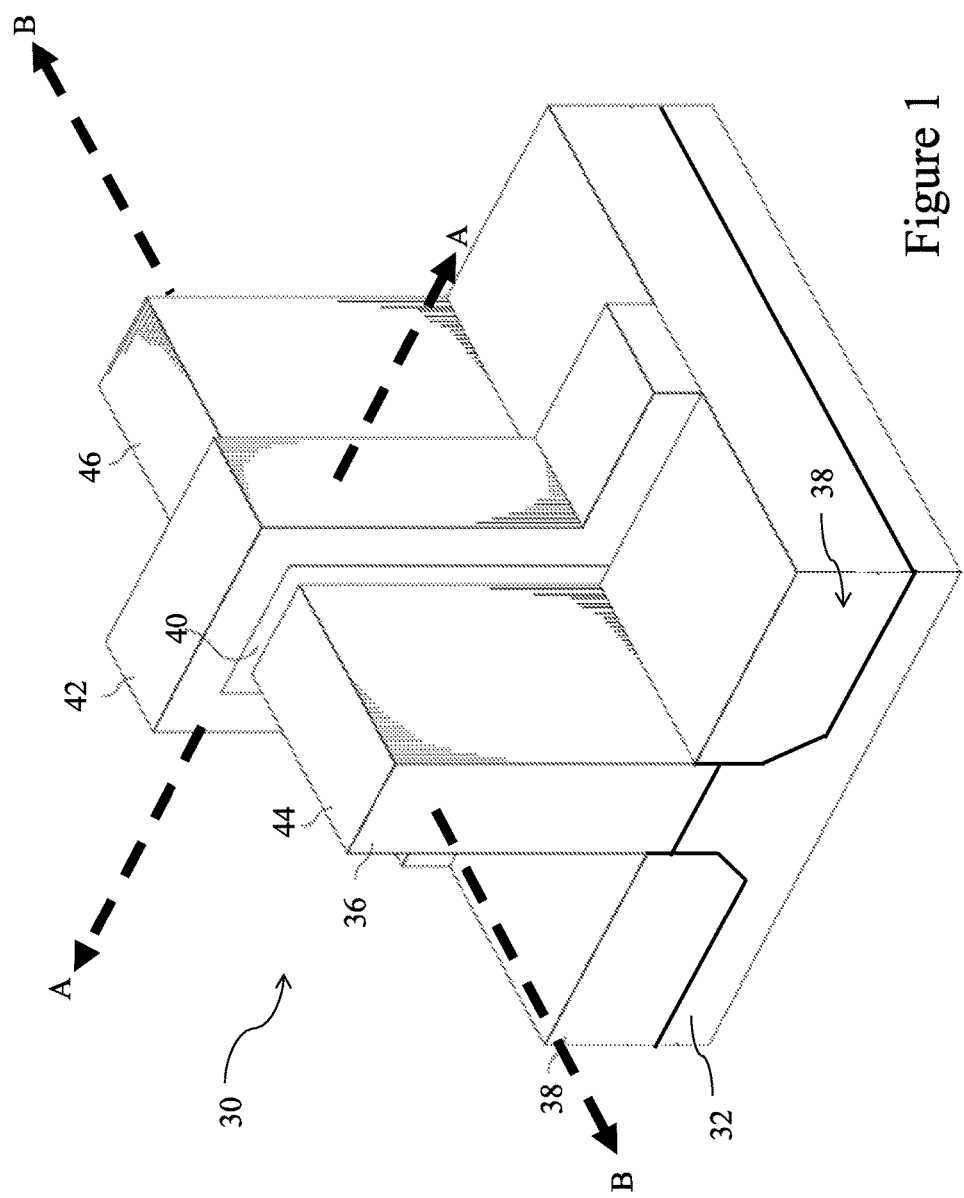
FIG. 1 illustrates a prospective view of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description, 'substantially' is used to account for deviations from mathematical precision caused by, for example, limitations of various manufacturing processes.

Various embodiments provide one or more of the following non-limiting advantages: source/drain epitaxy facet improvement; dummy active region cut patterning; improved source/drain contact opening landing process window, fewer short channel effects; fewer source/drain contact etch process loading requirements; improved reliability; reduced leakage current; and improved yield.

FIG. 1 illustrates an example of a fin field effect transistor (FinFET) 30 in a three-dimensional view. FinFET 30 includes a semiconductor fin 36 on a semiconductor substrate 32. Substrate 32 includes isolation regions 38, and fin 36 protrudes above and from between neighboring isolation regions 38. A gate dielectric 40 is along sidewalls and over a top surface of fin 36, and a gate electrode 42 is over gate dielectric 40. Gate dielectric 40 and gate electrode 42 make up a gate stack in finFET 30. Portions of fin 36 covered by gate dielectric 38/gate electrode 42 may be referred to as a channel region of finFET 30. Source/drain regions 44 and 46 are disposed in opposite sides of fin 36 with respect to the gate dielectric 40 and gate electrode 42. Cross-section A-A is across a channel, gate dielectric 40, and gate electrode 42 of finFET 30. Cross-section B-B is perpendicular to cross-section A-A and is along a longitudinal axis of fin 36 and in a direction of, for example, a current flow between the source/drain regions 44 and 46. Subsequent figures refer to these reference cross-sections for clarity.

Figure 2:
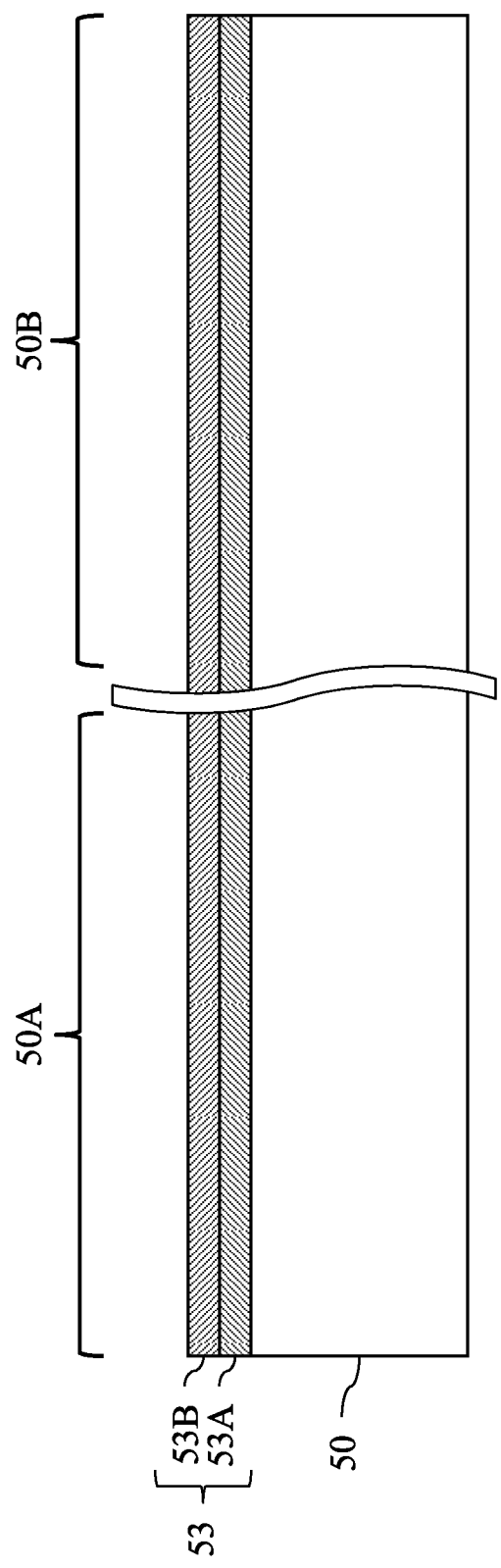

FIGS. 2, 3A, 3B, 4, 5A, 5B, 6, 7A, 7B, 8A, 8B, 9A, 9B, 10A, 10B, 11A, 11B, 12, 13A, 13B, 14A, 14B, 15A, 15B, 15C, 16A, 16B, 17A, 17B, 18A, 18B, 19A, and 19B are cross-sectional and top-down views of intermediate stages in the manufacturing of FinFETs in accordance with an exemplary embodiment. FIG. 2 illustrate reference cross-section A-A illustrated in FIG. 1, except for multiple FinFETs. In FIGS. 3A, 3B, 5A, 5B, 7A, 7B, 8A, 8B, 9A, 9B, 10A, 10B, 11A, 11B, 12, 13A, 13B, 15A, 15B, 16A, 16B, 17A, 17B, 18A, 18B, 19A, and 19B, figures ending with an "A" designation are illustrated along a similar cross-section A-A; figures ending with a "B" designation are illustrated along a similar cross-section B-B. FIGS. 4, 6, 14A, and 14B illustrate top-down views of multiple FinFETs according to an exemplary embodiment. FIG. 15C illustrates a cross-sectional view of a device taken along a similar cross-section B-B.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. Substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Substrate 50 has a first region 50A and a second region 50B. First region 50A can be for forming n-type devices, such as NMOS transistors, such as n-type FinFETs. Second region 50B can be for forming p-type devices, such as PMOS transistors, such as p-type FinFETs. Although FIG. 2 illustrates first region 50A and second region 5B as being adjacent, any number of features (e.g., other active devices, isolation regions, passive devices, and the like) may be disposed between first region 50A and second region 50B depending on device design.

As further illustrated by FIG. 2, a hard mask 53 may be disposed over substrate 50. The hard mask may comprise one or more oxide (e.g., silicon oxide layer 53A) and/or nitride (e.g., silicon nitride layer 53B) layers to reduce damage to the underlying substrate 50 during patterning in subsequent process steps. Hard mask 53 may be formed using any suitable deposition process, such as, atomic layer deposition (ALD), chemical vapor deposition (CVD), high density plasma CVD (HDP-CVD), physical vapor deposition (PVD), and the like.

FIGS. 3A, 3B, 4, 5A, 5B, 6, 7A, and 7B illustrate the patterning of substrate 50 to form semiconductor fins 52 (see FIGS. 7A and 7B) as well as define trenches 55A and 55B (see FIGS. 7A and 7B) between semiconductor fins 52 for subsequently formed isolation regions. In an embodiment, patterning substrate 50 comprises a combination of photolithography and etching. Patterning substrate 50 may include multiple photolithography and etching steps. For example, referring first to FIGS. 3A and 3B, after hard mask 53 is formed, a photoresist material may be blanket deposited over hard mask 53. The photoresist material may then be patterned by exposing the photoresist material to light using a photomask. Exposed or unexposed portions of the photoresist may then be removed depending on whether a positive or negative resist is used. The resulting patterned photoresist material is illustrated in FIGS. 3A and 3B as first photoresist 57. The pattern of first photoresist 57 may then be transferred to hard mask 53 using an etching process to define trenches 55A in hard mask 53. The pattern of first photoresist 57 may define trenches 55A in cross-section A-A (see FIG. 3A) without defining any trenches in cross-section B-B (see FIG. 3B).

Figure 4:
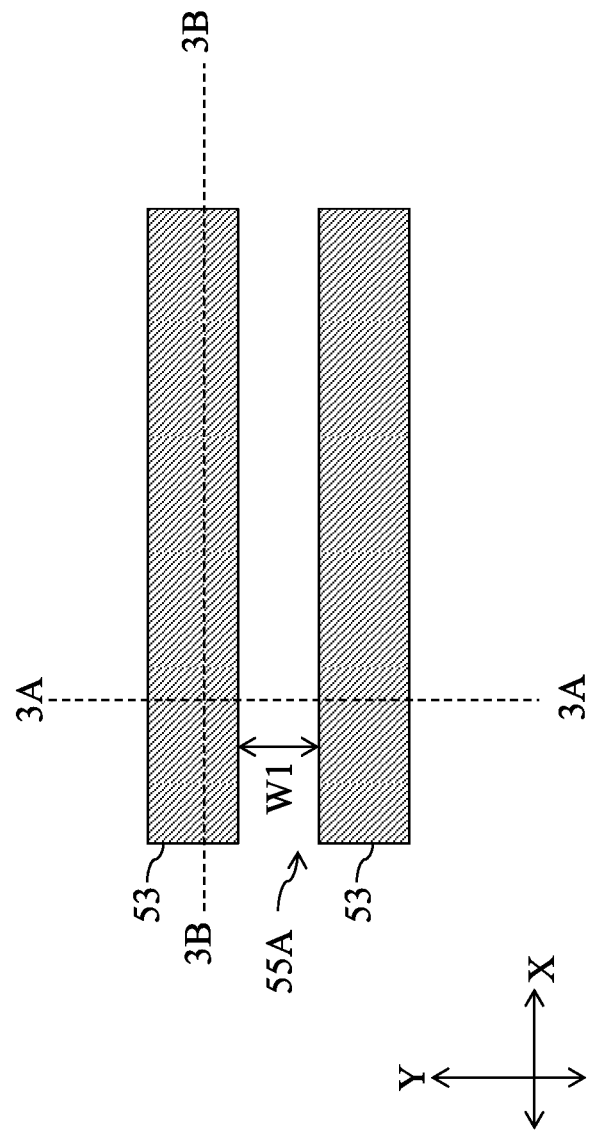

For example, FIG. 4 illustrates a top-down view of hard mask 53 after the pattern of first photoresist 57 has been transferred to hard mask 53. In FIG. 4, the cross-sectional view provided by FIG. 3A is taken along dashed line 3A-3A while the cross-sectional view provided by FIG. 3B is taken along dashed line 3B-3B. As shown by FIG. 4, a length of a trench 55A may extend in an x-direction, which may be substantially parallel to cross-section B-B of FIG. 3B. A width W1 of a trench 55A may extend in a y-direction, which may be substantially parallel to cross-section A-A of FIG. 3A. In some embodiments, width W1 of each trench 55A in the y-direction may be about 10 nm to about 1 μm. In other embodiments, width W1 may be a different dimension.

After the pattern of first photoresist 57 is transferred to hard mask 53, first photoresist 57 is removed in an ashing and/or wet strip processes, for example. Subsequently, in FIGS. 5A and 5B, a second photoresist 59 is formed and patterned over hard mask 53. For example, a photoresist material may be blanket deposited over hard mask 53. The blanket deposition process may be a non-conformal process, and the photoresist material may be deposited to fill trenches 55A (see FIG. 5A). The photoresist material may then be patterned by exposing the photoresist material to light using a photomask. Exposed or unexposed portions of the photoresist may then be removed depending on whether a positive or negative resist is used. The resulting patterned photoresist material is illustrated in FIGS. 5A and 5B as second photoresist 59. The pattern of second photoresist 59 may then be transferred to hard mask 53 using an etching process to define trenches 55B in hard mask 53. The pattern of second photoresist 59 may define trenches 55B in cross-section B-B (see FIG. 5B) without defining any additional trenches in cross-section A-A (see FIG. 5A).

Figure 6:
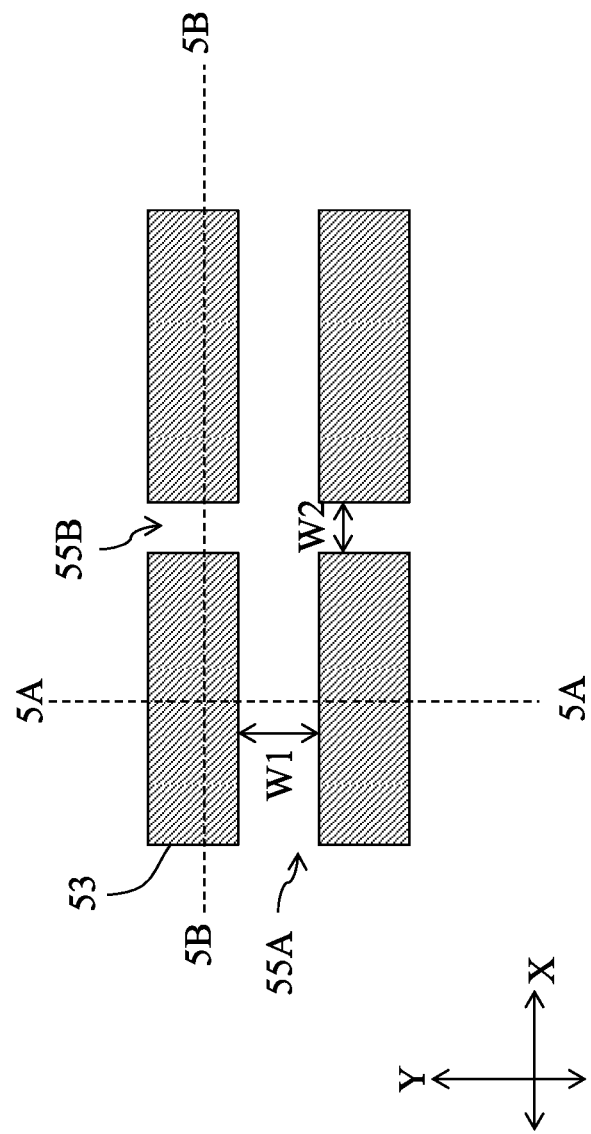

For example, FIG. 6 illustrates a top-down view of hard mask 53 after the pattern of second photoresist 59 has been transferred to hard mask 53. In FIG. 6, the cross-sectional view provided by FIG. 5A is taken along dashed line 5A-5A while the cross-sectional view provided by FIG. 5B is taken along dashed line 5B-5B. As shown by FIG. 5, a length of a trench 55B may extend in a y-direction, which may be substantially parallel to cross-section A-A of FIG. 5A. The length of trench 55B may also be substantially perpendicular to a length of a trench 55A. A width W2 of a trench 55B may extend in an x-direction, which may be substantially parallel to cross-section B-B of FIG. 3B. In some embodiments, width W2 of each trench 55B in the x-direction may be less than width W1 of each trench 55A in the y-direction. For example, width W2 may be about 2 nm to about 30 nm. In other embodiments, width W1 may be a different dimension. Widths W2 may further be less than a respective width (e.g., in the x-direction) of subsequently formed dummy gate structures (e.g., dummy gate 70, see FIG. 11B). After the pattern of second photoresist 59 is transferred to hard mask 53, second photoresist 59 is removed in an ashing and/or wet strip processes, for example.

Subsequently, trenches 55A and 55B are patterned into underlying substrate 50 using hard mask 53 as a patterning mask during an etching process as illustrated by FIGS. 7A and 7B. The etching of substrate 50 may include acceptable etch processes, such as a reactive ion etch (RIE), neutral beam etch (NBE), the like, or a combination thereof. The etching may be anisotropic. Subsequently, the photoresist is removed in an ashing and/or wet strip processes, for example. Thus, fins 52 are formed. Fins 52 extend upwards from a base substrate 50 between adjacent trenches 55A/55B. As discussed above, FIGS. 7A and 7B illustrate perpendicular cross-sections. Thus, lengths of trenches 55A and 55B may also be substantially perpendicular. Furthermore, widths W1 of trenches 55A (e.g., between adjacent fins 52 in cross-section A-A) may be greater than widths W2 of trenches 55B (e.g., between adjacent fins 52 in cross-section B-B). The difference in widths may be achieved, at least in part, by the multi-step photolithography process as described above.

In an embodiment, fins 52 extend above substrate 50 to a height H1 of about 5 nm to about 200 nm. In an embodiment, each fin 52 may be sufficiently long to allow for the formation of multiple dummy gate stacks on each fin 52 in subsequent process steps. For example, a critical dimension (CD) L1 of each fin 52 in cross-section B-B (see FIG. 1) may be about 5 nm to about 20 nm, where CD L1 is measured from a first sidewall of a fin 52 to a respective first sidewall of an adjacent fin 52. In other embodiments, fins 52 may have different dimensions.

In FIGS. 8A and 8B, an insulation material is formed between neighboring fins 52 to form isolation regions 54 in trenches 55A and 55B (see FIGS. 3A and 3B). The insulation material of isolation regions 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, isolation regions 54 comprise silicon oxide formed by a FCVD process. In some embodiments, isolation regions 54 may be formed to overflow trenches 55A and 55B (see FIGS. 7A and 7B) and cover top surfaces of fins 52. Subsequently, a planarization process, such as a chemical mechanical polish (CMP), may remove any excess insulation material and form top surfaces of the isolation regions 54 and top surfaces of the fins 52 that are coplanar. The planarization process may also remove mask 53 (see FIGS. 7A and 7B) from top surfaces of fins 52. In other embodiments, mask 53 may be removed using a separate process than planarization.

Furthermore, in some embodiments, isolation regions 54 may include a conformal liner (not illustrated) formed on sidewalls and a bottom surface of trenches 55A and 55B (see FIGS. 7A and 7B) prior to the filling of trenches 55A and 55B with an insulation material of isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of the liner may include any suitable method, such as, ALD, CVD, high density plasma (HDP) CVD, PVD, and the like. In such embodiments, the liner may prevent (or at least reduce) the diffusion of semiconductor material from fins 52 (e.g., Si and/or Ge) into the surrounding isolation regions 54 during the annealing of isolation regions 54.

FIGS. 9A and 9B illustrate the recessing of the isolation regions 54 to form shallow trench isolation (STI) regions 54. The isolation regions 54 are recessed such that fins 56 in first region 50A and in second region 50B protrude from between neighboring isolation regions 54 along the cross-section A-A (see FIG. 1) as illustrated by FIG. 9A. However, at least a portion of isolation regions 54 between adjacent fins 52/56 may not be recessed along cross-section B-B (see FIG. 1) as illustrated by FIG. 9B. Further, the top surfaces of isolation regions 54 may have a flat surface as illustrated, a convex surface, a concave surface (such as dishing), or a combination thereof. The top surfaces of isolation regions 54 may be formed flat, convex, and/or concave by an appropriate etch. Isolation regions 54 may be recessed using an acceptable etching process, such as one that is selective to the material of isolation regions 54. For example, a chemical oxide removal using a CERTAS® etch or an Applied Materials SICONI tool or dilute hydrofluoric (dHF) acid may be used. A masking layer may be formed to selectively etch isolation regions 54 in trenches 55A (see FIG. 7A) without etching at least portions of isolation regions 5B in trenches 55B (see FIG. 7B).

A person having ordinary skill in the art will readily understand that the process described with respect to FIGS. 2 through 9B is just one example of how fins 56 may be formed. In other embodiments, a dielectric layer can be formed over a top surface of substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, semiconductor strips 52 in FIGS. 7A and 7B can be recessed, and a material different from semiconductor strips 52 may be epitaxially grown in their place. In an even further embodiment, a dielectric layer can be formed over a top surface of substrate 50; trenches can be etched through the dielectric layer; heteroepitaxial structures can be epitaxially grown in the trenches using a material different from substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIGS. 9A and 9B, appropriate wells may be formed in fins 56, fins 52, and/or substrate 50. For example, a P well may be formed in first region 50A, and an N well may be formed in the second region 50B.

The different implant steps for the different regions 50A and 50B may be achieved using a photoresist or other masks (not shown). For example, a photoresist is formed over fins 56 and isolation regions 54 in first region 50A. The photoresist is patterned to expose second region 50B of substrate 50, such as a PMOS region. The photoresist can be formed by using a spin-on technique and can be patterned using acceptable photolithography techniques. Once the photoresist is patterned, an n-type impurity implant is performed in second region 50B, and the photoresist may act as a mask to substantially prevent n-type impurities from being implanted into first region 50A, such as an NMOS region. The n-type impurities may be phosphorus, arsenic, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist is removed, such as by an acceptable ashing process.

Following the implanting of second region 50B, a photoresist is formed over fins 56 and isolation regions 54 in second region 50B. The photoresist is patterned to expose first region 50A of the substrate 50, such as the NMOS region. The photoresist can be formed by using a spin-on technique and can be patterned using acceptable photolithography techniques. Once the photoresist is patterned, a p-type impurity implant may be performed in first region 50A, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist may be removed, such as by an acceptable ashing process.

After the implants of first region 50A and second region 50B, an anneal may be performed to activate the p-type and n-type impurities that were implanted. The implantations may form a p-well in first region 50A, e.g., the NMOS region, and an n-well in second region 50B, e.g., the PMOS region. In some embodiments, the grown materials of epitaxial fins may be in situ doped during growth, which may obviate the implantations, although in situ and implantation doping may be used together.

In FIGS. 10A and 10B, a dummy dielectric layer 58 is formed on fins 56 and over isolation regions 54. Dummy dielectric layer 58 may be, for example, silicon oxide, silicon nitride, a combination thereof, or the like, and may be deposited or thermally grown according to acceptable techniques, CVD, PVD, ALD, combinations thereof, or the like. Although the illustrated embodiments disclose dummy dielectric layer 58 on fins 56 and isolation regions 54, in other embodiments, dummy dielectric layer 58 may be selectively formed only on a semiconductor material (e.g., only on fins 56) and not on isolation regions 54. Dummy gate layer 60 is formed over dummy dielectric layer 58, and a mask layer 62 is formed over dummy gate layer 60. Dummy gate layer 60 may be deposited over dummy dielectric layer 58 and then planarized, such as by a CMP. Mask layer 62 may be deposited over dummy gate layer 60. Dummy gate layer 60 may be made of, for example, polysilicon, although other materials that have a high etching selectivity from the etching of isolation regions 54 may also be used. Mask layer 62 may include, for example, silicon nitride or the like. In this example, a single dummy gate layer 60 and a single mask layer 62 are formed across first region 50A and second region 50B. In other embodiments, separate dummy gate layers may be formed in first region 50A and second region 50B, and separate mask layers may be formed in first region 50A and second region 50B.

Figure 11A:
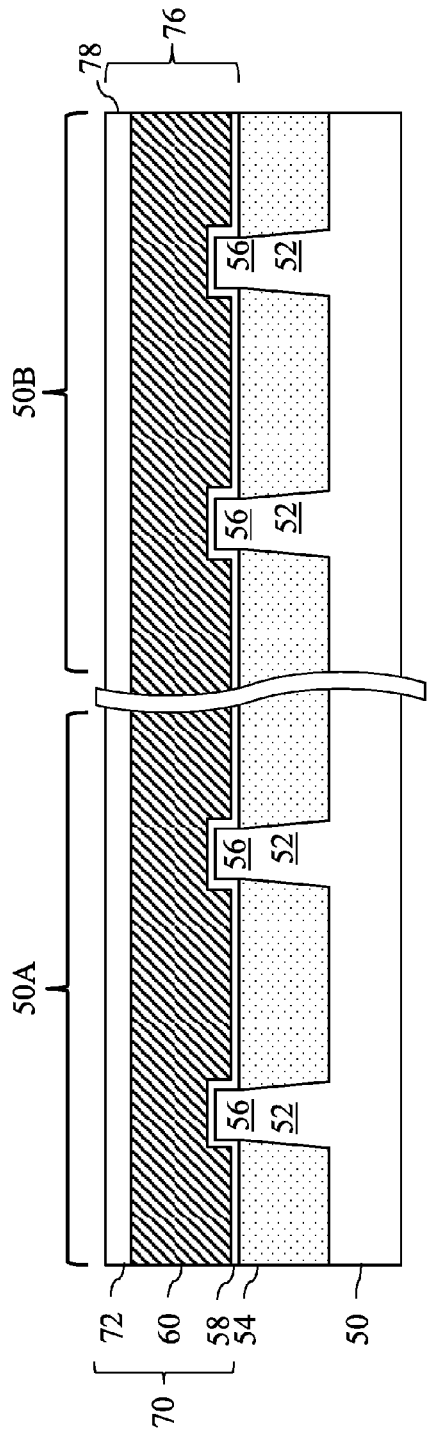
Figure 11B:
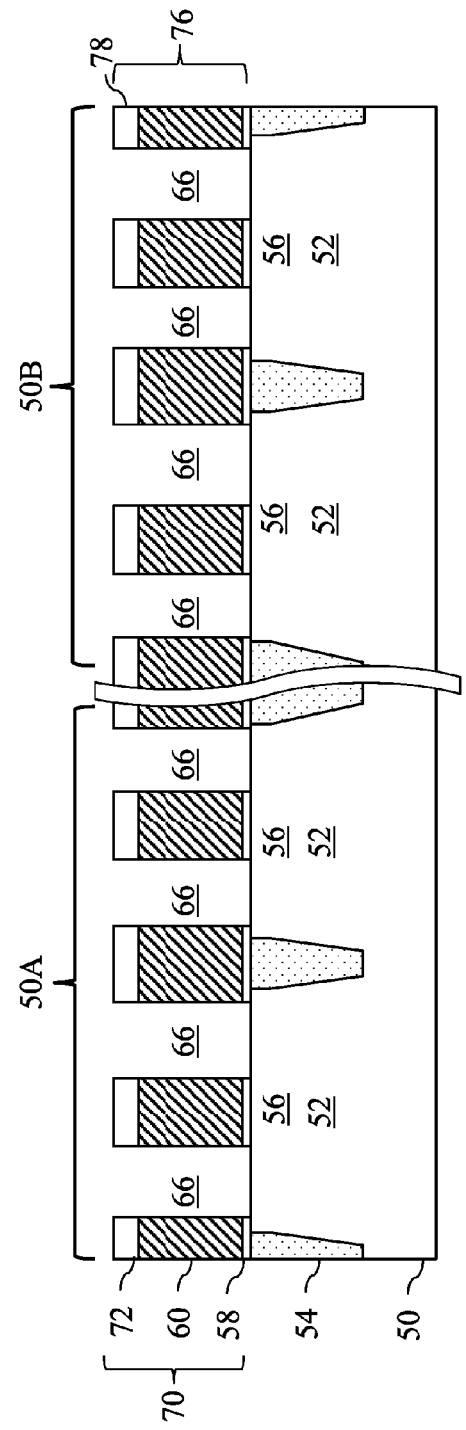

In FIGS. 11A and 11B, mask layer 62 may be patterned using acceptable photolithography and etching techniques to form masks 72 in first region 50A and masks 78 in second region 50B. The pattern of the masks 72 and 78 then may be transferred to dummy gate layer 60 and dummy dielectric layer 58 by an acceptable etching technique to form dummy gate stacks 70 in first region 50A and dummy gate stacks 76 in the second region 50B. Dummy gate stacks 70 and 76 cover respective channel regions of fins 56. Dummy gate stacks 70 and 76 may also have a lengthwise dimension substantially perpendicular to the lengthwise dimension of respective epitaxial fins (see e.g., FIG. 12).

Referring to FIG. 11B, the patterning of dummy gate stacks 70 and 76 may define openings 66 between adjacent dummy gate stacks 70 and 76. Openings 66 may expose a top surface of fins 56. Each fin 52/56 may be disposed under multiple dummy gates 70/76. For example, a fin 52/56 may be disposed under at least three dummy gate stacks 70/76. It has been observed that by disposing fins 52/56 under multiple dummy gates, a topology of an upper surface of fins 56 after etching openings 66 may be improved. For example, an upper surface of fins 56 may be more planar. It has been observed that by increasing the pattern density and uniformity of openings 66 (e.g., by providing more dummy gate stacks 70 and 76), etch loading requirements for etching openings 66 may be reduced. Thus, the topography of a top surface fins 56 may be improved after etching.

Furthermore, at least a subset of the dummy gate stacks 70 and 76 span an entire distance over an isolation region 54 and between adjacent fins 52/56, and sidewalls of each fin 52 may be disposed directly under a respective dummy gate stack 70 or 76. In an embodiment, lines extending along an interface of each fin 52/56 and a respective isolation region 54 may also extend through a dummy gate stack 70 or 76. For example, dummy gate stacks 70 include a dummy gate stack 70A disposed directly above and aligned with a STI region 54 in first region 50A, and dummy gate stacks 76 include a dummy gate stack 76A disposed directly above and aligned with a STI region 54 in second region 50B. In various embodiments, a width W3 of each dummy gate stack 70A and 76A in cross-section B-B (see FIG. 11B) is greater than respective widths W2 of underlying STI regions 54. For example, in embodiments where widths W2 are about 2 nm to about 30 nm, widths W2 of dummy gate stacks 70A and 76A may be about 10 nm to about 45 nm. In other embodiments, widths W2 and/or W3 may have different values.

Figure 12:
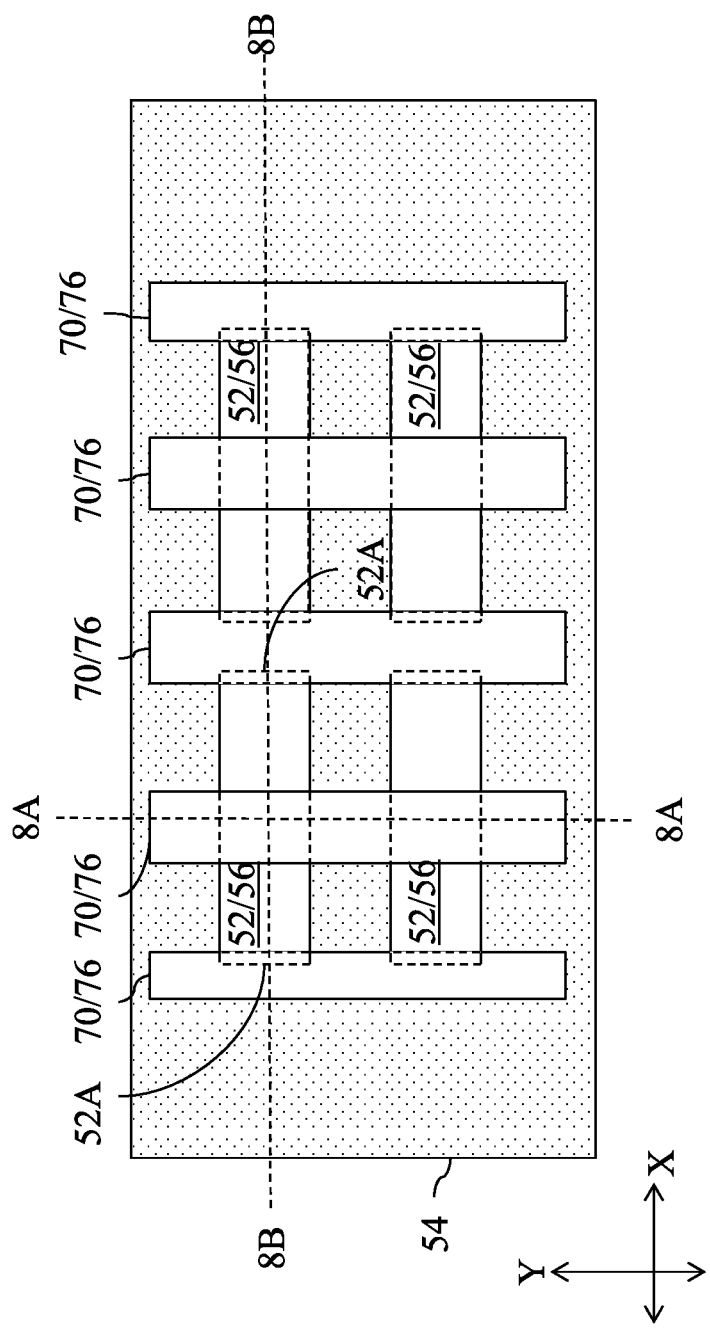

FIG. 12 illustrates a top-down view of dummy gates 70/76 and underlying fins 52/56 in either first region 50A or second region 50B. In the top-down view of FIG. 9, the cross-sectional view provided by FIG. 8A is taken along dashed line 8A-8A while the cross-sectional view provided by FIG. 8B is taken along dashed line 8B-8B. Furthermore, in FIG. 12, the portions of fins 52/56 disposed under dummy gates 70/72 are shown in ghost for reference. As illustrated by FIG. 12, each fin 52/56 extends from under a first dummy gate 70/76 to under a second dummy gate 70/76, and edges 52A (e.g., opposing sidewalls) of fins 52/56 are disposed under dummy gates 70/76. Furthermore, a width of a dummy gate 70/76 (e.g., along the x direction) may span a distance between adjacent fins 52/56 in the x-direction (e.g., along a lengthwise dimension of fins 52/56 and perpendicular to a lengthwise dimension of dummy gates 70/76).

Figure 13A:
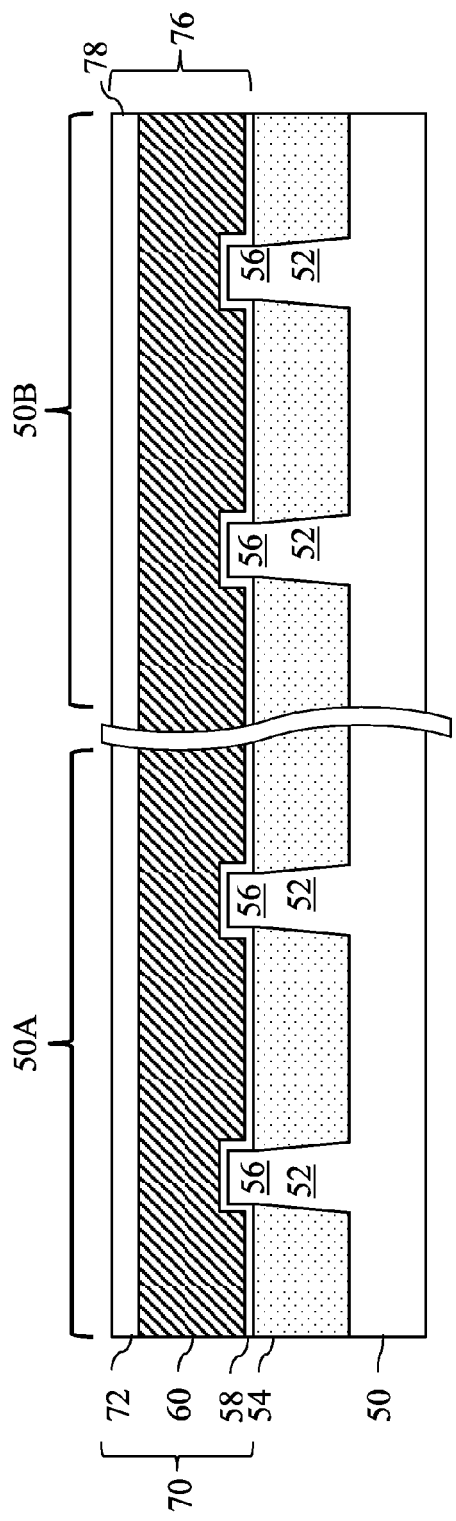
Figure 13B:
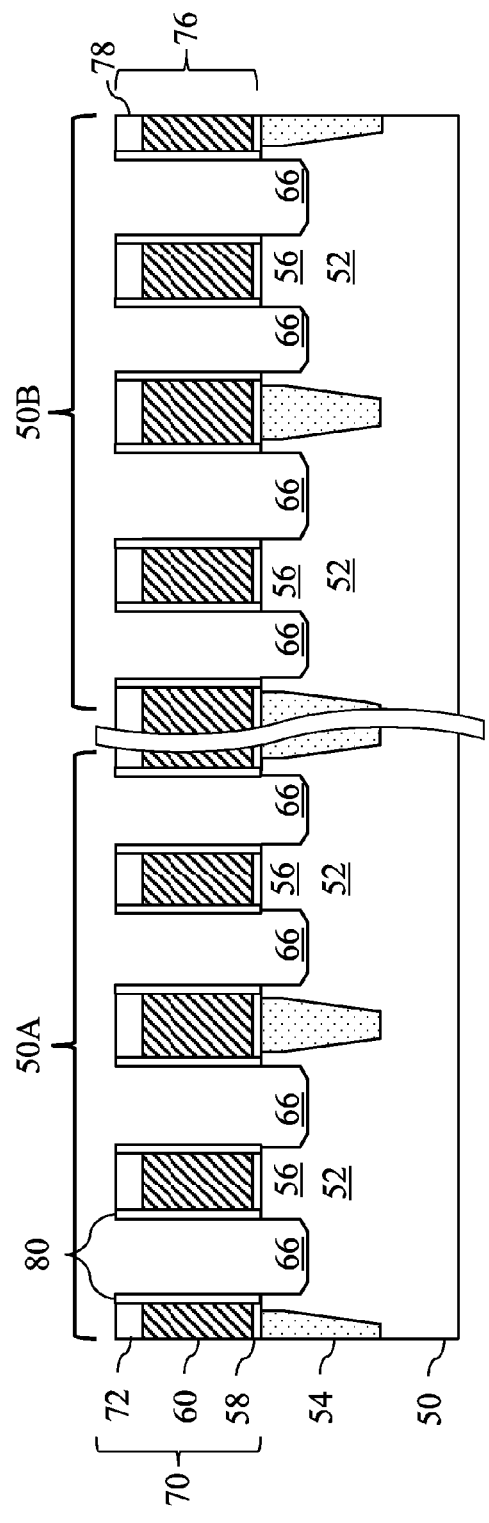

In FIGS. 13A and 13B, gate spacers 80 can be formed on exposed surfaces of respective dummy gate stacks 70 and 76 and/or fins 56. A thermal oxidation or a deposition followed by an anisotropic etch may form gate spacers 80.

After the formation of the gate spacers 80, implants for lightly doped source/drain (LDD) regions may be performed. Similar to the implants discussed above in FIGS. 9A and 9B, a mask, such as a photoresist, may be formed over first region 50A, e.g., NMOS region, while exposing second region 50B, e.g., PMOS region, and p-type impurities may be implanted into the exposed fins 56 in second region 50B. The mask may then be removed. Subsequently, a mask, such as a photoresist, may be formed over second region 50B while exposing first region 50A, and n-type impurities may be implanted into the exposed fins 56 in first region 50A. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

As further illustrated by FIG. 13B, an etching may be performed to extend openings 66 into the semiconductor material of fins 52/56. It has been observed that by increasing the pattern density and uniformity of openings 66 (e.g., by providing more dummy gate stacks 70 and 76), etch loading requirements for etching openings 66 into the semiconductor material of fins 52/56 may be reduced. Thus, the topography of a top surface fins 56 may be improved after etching. During etching, gate spacers 80 and hard masks 72/78 may mask underlying dummy gate layers 60 and portions of fins 56/52 from etching. The resulting portion of openings 66 in fins 56/52 may be surrounded on all sides of a semiconductor material of fins 56/52.

Figure 14A:
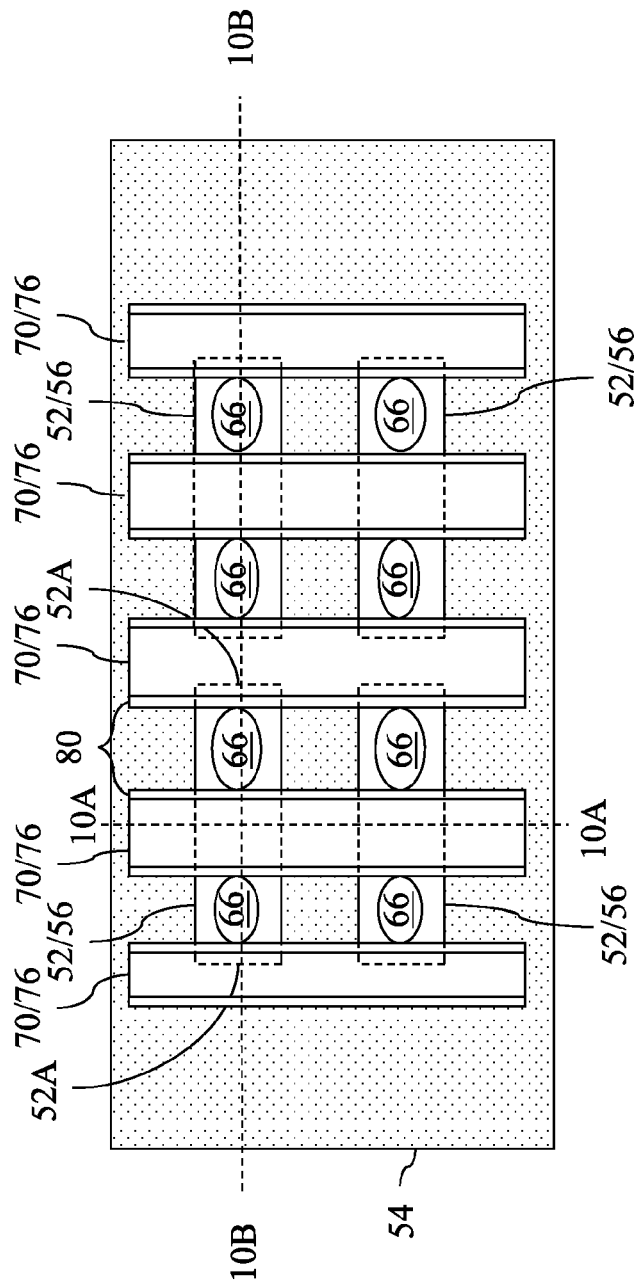
Figure 14B:
Figure 15C:
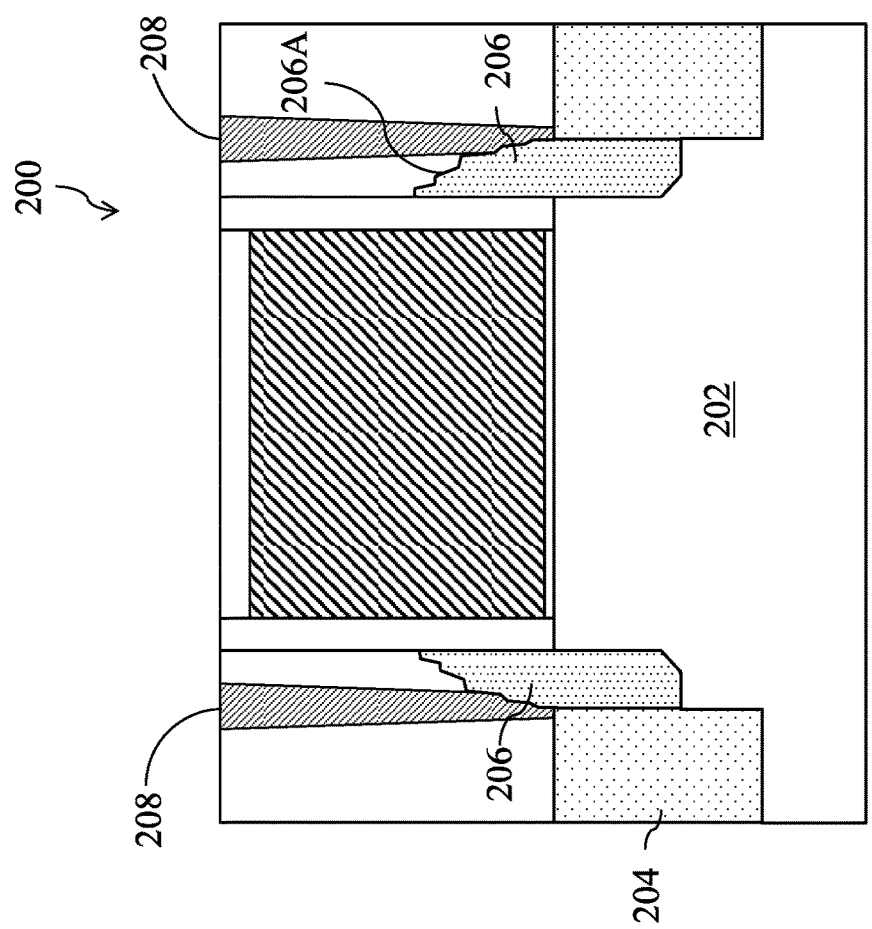
FIG. 15C illustrates a cross-sectional view of a semiconductor device.

For example, referring to the top-down views provided by FIGS. 14A and 14B, the sidewalls of openings 66 in fins 56/52 are shown. In FIG. 14A, the cross-sectional view provided by FIG. 13A is taken along dashed line 13A-13A while the cross-sectional view provided by FIG. 13B is taken along dashed line 13B-13B. As illustrated, a portion of openings 66 in fins 56/52 may be surrounded on all sides by a same semiconductor material (e.g., the semiconductor material of fins 56/52). In other embodiments, openings 66 may be surrounded on at least two opposing sides (e.g., sides aligned with sidewalls of spacers 80) by a same semiconductor material. In such embodiments, other sides of openings 66 may be bounded by STI regions 54.

It has been observed that when source/drain regions are subsequently grown in openings 66 on fins 52/56, more uniform conditions can be provided during the epitaxy, which reduces the formation of facets, short channel effects (e.g., due to the increased size of subsequently formed source/drain regions), improved uniformity, reduced defects, and the like. Furthermore, improved epitaxial regions (e.g., having reduced facets and/or short channel effects) are formed when the epitaxy process is performed on a semiconductor material (e.g., the material of fins 52/56) compared to a dielectric material (e.g., the material of isolation regions 54).

In FIGS. 15A and 15B, epitaxial source/drain regions 82 and 84 are formed in openings 66 on fins 56. In first region 50A, epitaxial source/drain regions 82 are formed in fins 56 such that at least one dummy gate 70 is disposed between respective neighboring pairs of epitaxial source/drain regions 82. In some embodiments, epitaxial source/drain regions 82 may extend into the fins 52. In second region 50B, epitaxial source/drain regions 84 are formed in fins 56 such that at least one dummy gate stack 76 is disposed between respective neighboring pairs of epitaxial source/drain regions 84. In some embodiments, epitaxial source/drain regions 84 may extend into the fins 52. In some embodiments, because epitaxial source/drain regions 82 and 84 are formed in openings 66, a semiconductor material of fins 52/56 may encircle at least a bottom portion of epitaxial source/drain regions 82 and 84 in a top-down view.

In an embodiment, each epitaxial source/drain region 82 and 84 extends above a bottom surface of openings 66 to a height H2 of about 5 nm to about 200 nm. Furthermore, a CD L2 of each epitaxial source/drain region 82 and 84 in cross-section B-B (see FIG. 1) may be about 10 nm to about 20 nm, where CD L2 is measured from a first sidewall of an epitaxial source/drain region 82 and 84 to a respective first sidewall of an adjacent epitaxial source/drain region 82 and 84. In other embodiments, epitaxial source/drain region 82 and/or 84 may have different dimensions.

Epitaxial source/drain regions 82 in first region 50A, e.g., the NMOS region, may be formed by masking second region 50B, e.g., the PMOS region. Then, epitaxial source/drain regions 82 in first region 50A are epitaxially grown in openings 66 on the semiconductor material of fins 56/52. In some embodiments, openings 66 may be patterned in fins 56/52 in first region 50A while second region 50B is masked and formed at a different time than openings 66 in second region 50B. For example, epitaxial source/drain regions 82 may be grown prior to or later than extending openings 66 into fins 56/52 in second region 50B.

Epitaxial source/drain regions 82 may include any acceptable material, such as appropriate for n-type FinFETs. For example, if fin 56 is silicon, epitaxial source/drain regions 82 may include silicon, SiC, SiCP, SiP, or the like. A lattice constant of epitaxial source/drain regions 82 may be different than fins 56/52. Epitaxial source/drain regions 82 may have surfaces raised from respective surfaces of the fins 56 and may have facets. Subsequently, the mask on second region 50B may be removed.

Epitaxial source/drain regions 84 in second region 50B, e.g., the PMOS region, may be formed by masking first region 50A, e.g., the NMOS region, and epitaxially growing epitaxial source/drain regions 84 in second region 50B in openings 66 on the semiconductor material of fins 56/52. In some embodiments, openings 66 may be patterned in fins 56/52 in second region 50B while first region 50A is masked and formed at a different time than openings 66 in second region 50B. For example, epitaxial source/drain regions 84 may be grown prior to or later than extending openings 66 into fins 56/52 in first region 50A.

Epitaxial source/drain regions 84 may include any acceptable material, such as appropriate for p-type FinFETs. For example, if fin 56 is silicon, epitaxial source/drain regions 84 may comprise SiGe, SiGeB, Ge, GeSn, or the like. A lattice constant of epitaxial source/drain regions 84 may be different than fins 56/52. Epitaxial source/drain regions 84 may have surfaces raised from respective surfaces of the fins 56 and may have facets. Subsequently, the mask on first region 50A may be removed.

Because epitaxial source/drain regions 82 and 84 are formed in openings surrounded by a same semiconductor material, epitaxial source/drain regions 82 and 84 may have fewer facets than an epitaxial region formed on both semiconductor material and insulating material. For example, FIG. 15C illustrates a device 200 having epitaxial source/drain regions 206 formed on both semiconductor material 202 and an insulating material 204. As illustrated by FIG. 15C, epitaxial source/drain regions 206 may have more facets than epitaxial source/drain regions 82 and 84 (see FIG. 15B). For example, top surfaces 206A of epitaxial source/drain regions 206 may be relatively uneven and less planar than respective top surfaces of epitaxial source/drain regions 82 and 84 (see FIG. 15B). It has been observed that by forming epitaxial source/drain regions 82 and 84 with fewer facets using the processes described herein, various advantages may be provided, such as, a larger and more reliable landing surface for subsequently formed source/drain contacts (e.g., contacts 102/104, see FIG. 19B), fewer process requirements for source/drain contact opening etching in subsequent process steps, fewer short channel effects, fewer manufacturing defects, improved reliability, reduced leakage current, or a combination thereof. For example, as illustrated by FIG. 15C, the relatively small size/lack of uniformity of top surfaces 206A may result in a relatively small landing window for forming source/drain contacts 208. Thus, source/drain contacts 208 may be formed under more stringent patterning requirements, and source/drain contacts 208 may be misaligned with epitaxial source/drain regions 206.

Epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in first region 50A, e.g., the NMOS region, may be any of the n-type impurities previously discussed, and the p-type impurities for source/drain regions in second region 50B, e.g., the PMOS region, may be any of the p-type impurities previously discussed. In other embodiments, epitaxial source/drain regions 82 and 84 may be in situ doped during growth.

Figure 16A:
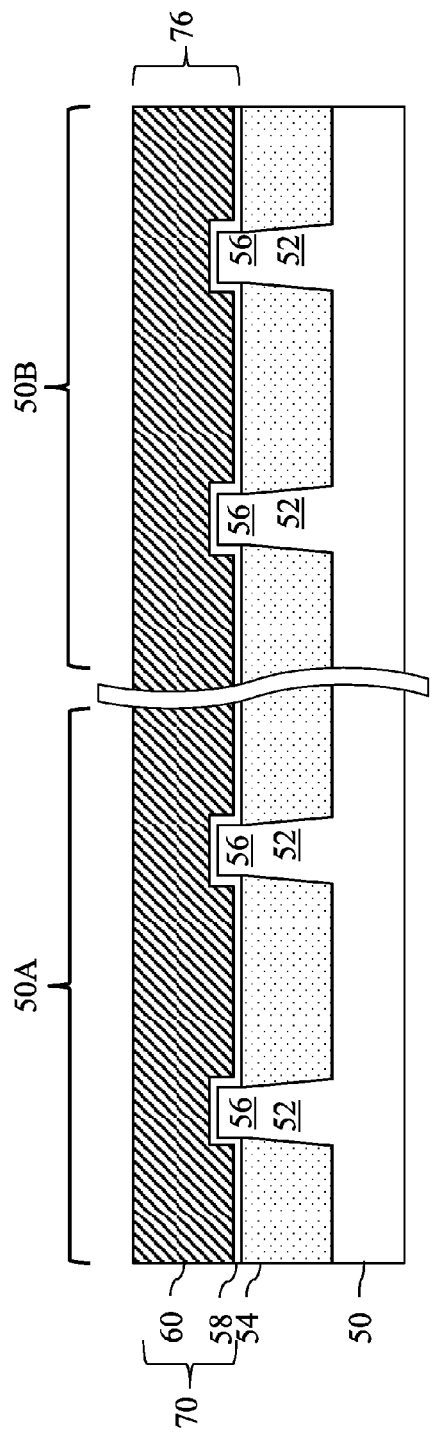
FIGS. 16A, 16B, 17A, 17B, 18A, 18B, 19A, and 19B illustrate cross-sectional and top-down views of various intermediary stages of manufacturing a semiconductor device according to some embodiments.
Figure 16B:
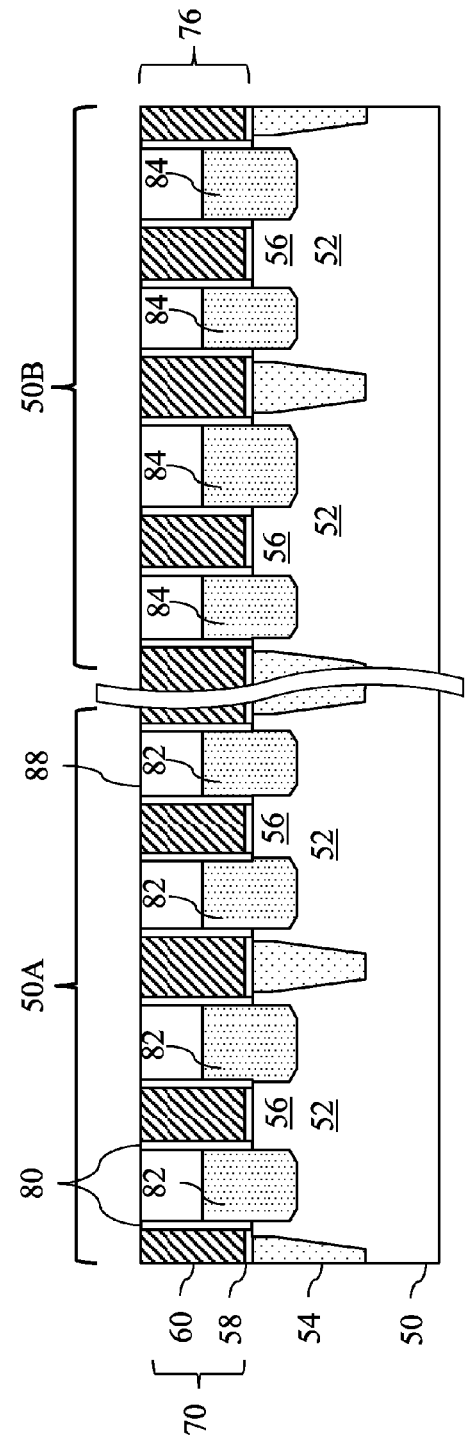

In FIGS. 16A and 16B, an ILD 88 is deposited over the structure illustrated in FIGS. 15A and 15B. In an embodiment, ILD 88 is a flowable film formed by a flowable CVD. In some embodiments, ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD. In some embodiments, ILD 88 may be formed to cover a top surface of dummy gate stacks 70/76 (including masks 72 and 78, see FIGS. 15A and 15B). Subsequently, a planarization process, such as a CMP, may be performed to level the top surface of ILD 88 with the top surfaces of dummy gate stacks 70 and 76. The CMP may also remove masks 72 and 78 on dummy gate stacks 70 and 76. Accordingly, top surfaces of dummy gate stacks 70 and 76 are exposed through ILD 88. In other embodiments, masks 72 and 78 are removed using a separate process than the planarization of ILD 88.

Figure 17A:
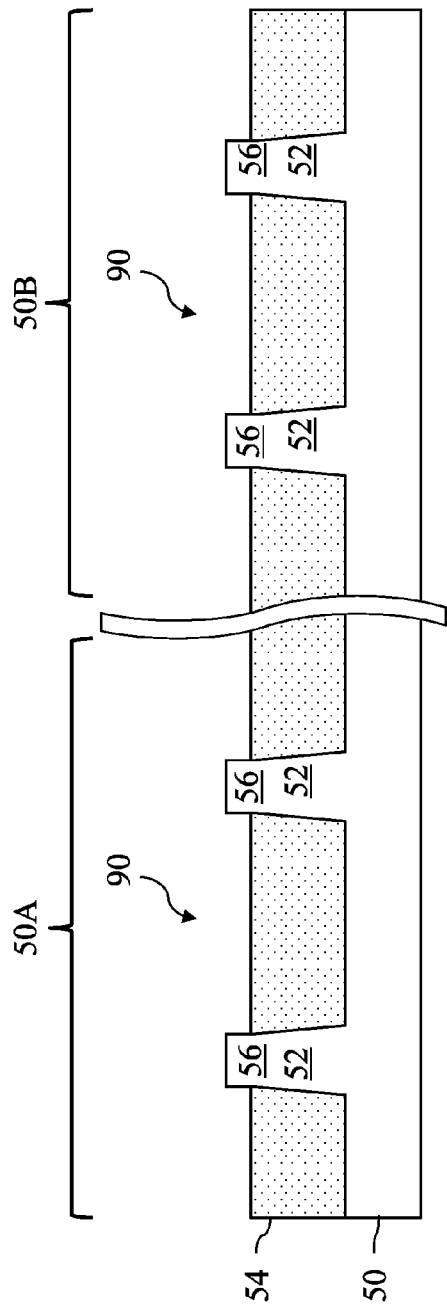
Figure 17B:
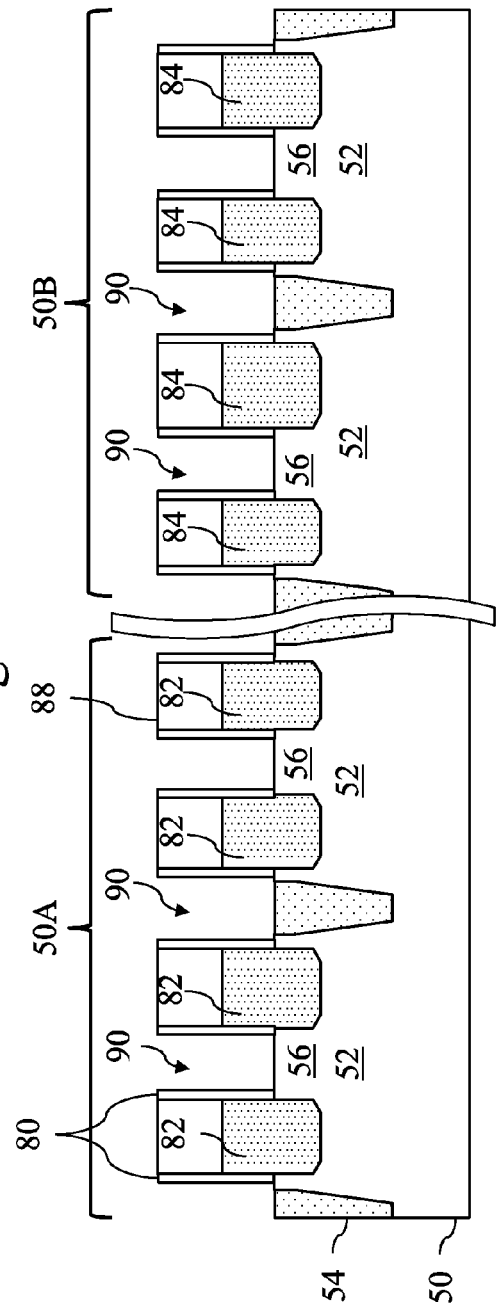

In FIGS. 17A and 17B, dummy gate stacks 70 and 76, are removed in an etching step(s), so that recesses 90 are formed between gate spacers 80. Each recess 90 exposes a channel region of a respective fin 56. Each channel region is disposed between neighboring pairs of epitaxial source/drain regions 82 and 84.

Figure 18A:
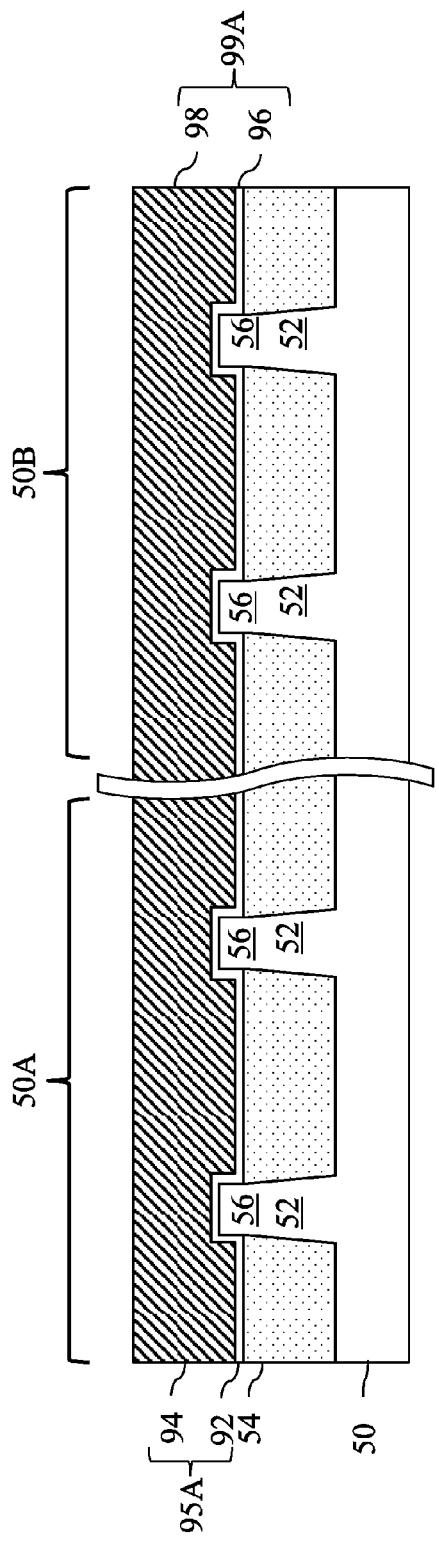
Figure 18B:
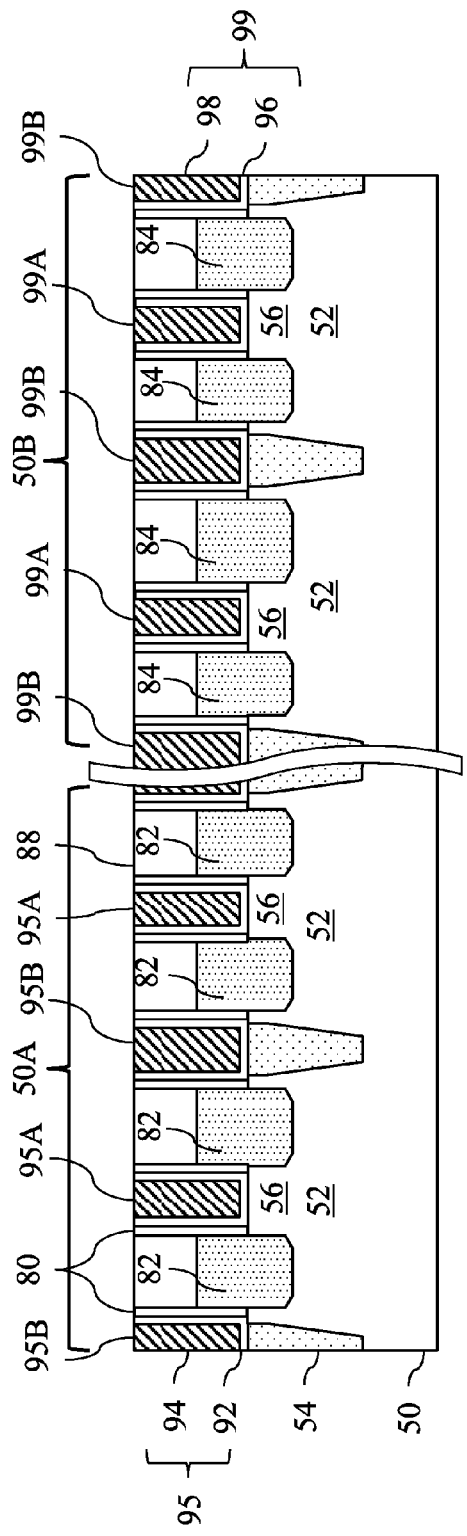

In FIGS. 18A and 18B, gate dielectric layers 92 and 96 and gate electrodes 94 and 98 are formed for replacement gates. Gate dielectric layers 92 and 96 are deposited conformally in recesses 90, such as on the top surfaces and the sidewalls of fins 56 and on sidewalls of the gate spacers 80, and on a top surface of ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gate stacks 95 and 99 of the resulting FinFETs.

The formation of the gate dielectric layers 92 and 96 may occur simultaneously such that gate dielectric layers 92 and 96 are made of the same materials, and the formation of gate electrodes 94 and 98 may occur simultaneously such that gate electrodes 94 and 98 are made of the same materials. However, in other embodiments, gate dielectric layers 92 and 96 may be formed by distinct processes, such that gate dielectric layers 92 and 96 may be made of different materials, and gate electrodes 94 and 98 may be formed by distinct processes, such that gate electrodes 94 and 98 may be made of different materials. Various masking steps may be used to mask and expose appropriate regions when using distinct processes.

As illustrated in FIG. 18B, some replacement gate stacks 95 and 99 (labeled 95A or 99A) are functional gate stacks which may be used to apply an appropriate voltage to a channel region within fins 56 and turn the resulting FinFETs on and/or off. Other replacement gate stacks 95 and 99 (labeled 95B or 99B) are dummy gate stacks disposed on isolation regions 54. Dummy gate stacks 95B and 99B may not be used to turn the resulting FinFETS on and/or off. For example, dummy gate stacks 95B and 99B may be electrically isolated from other conductive vias and/or lines in the resulting device.

Figure 19A:
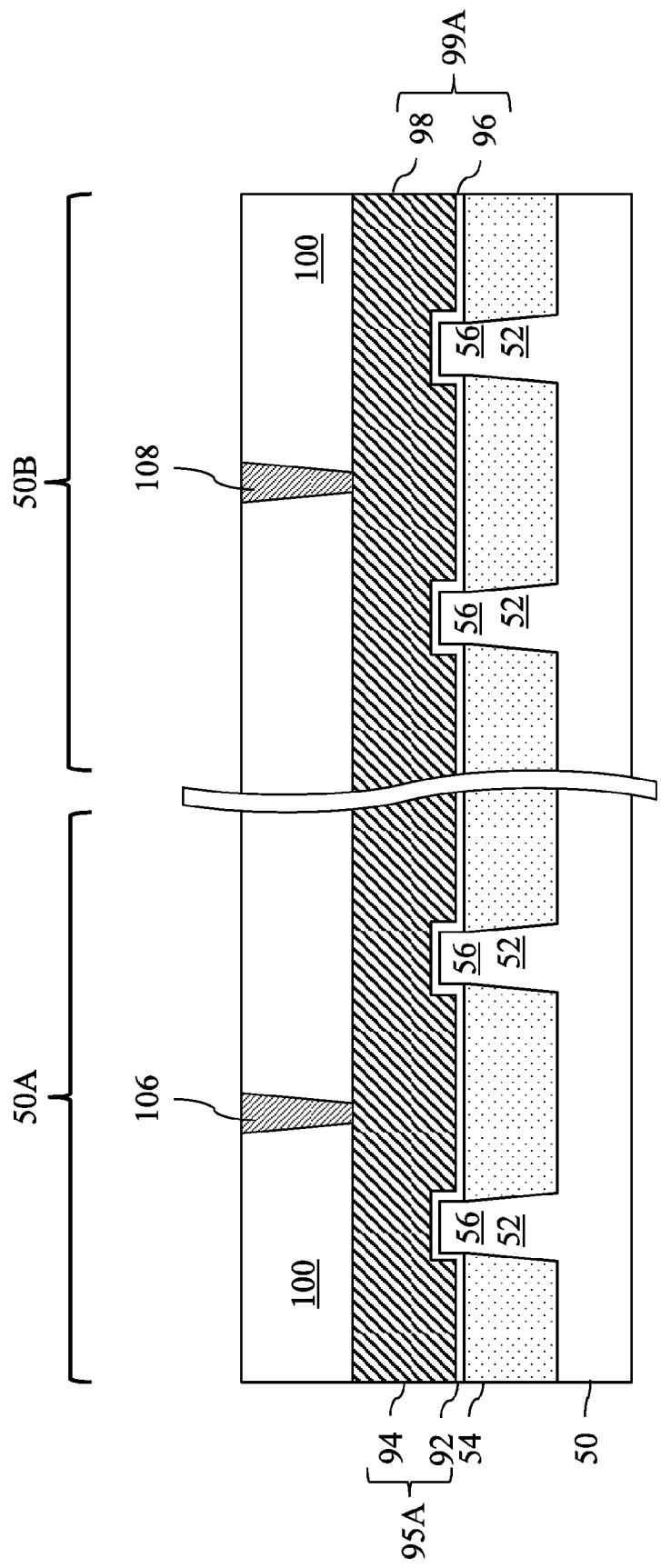
Figure 19B:
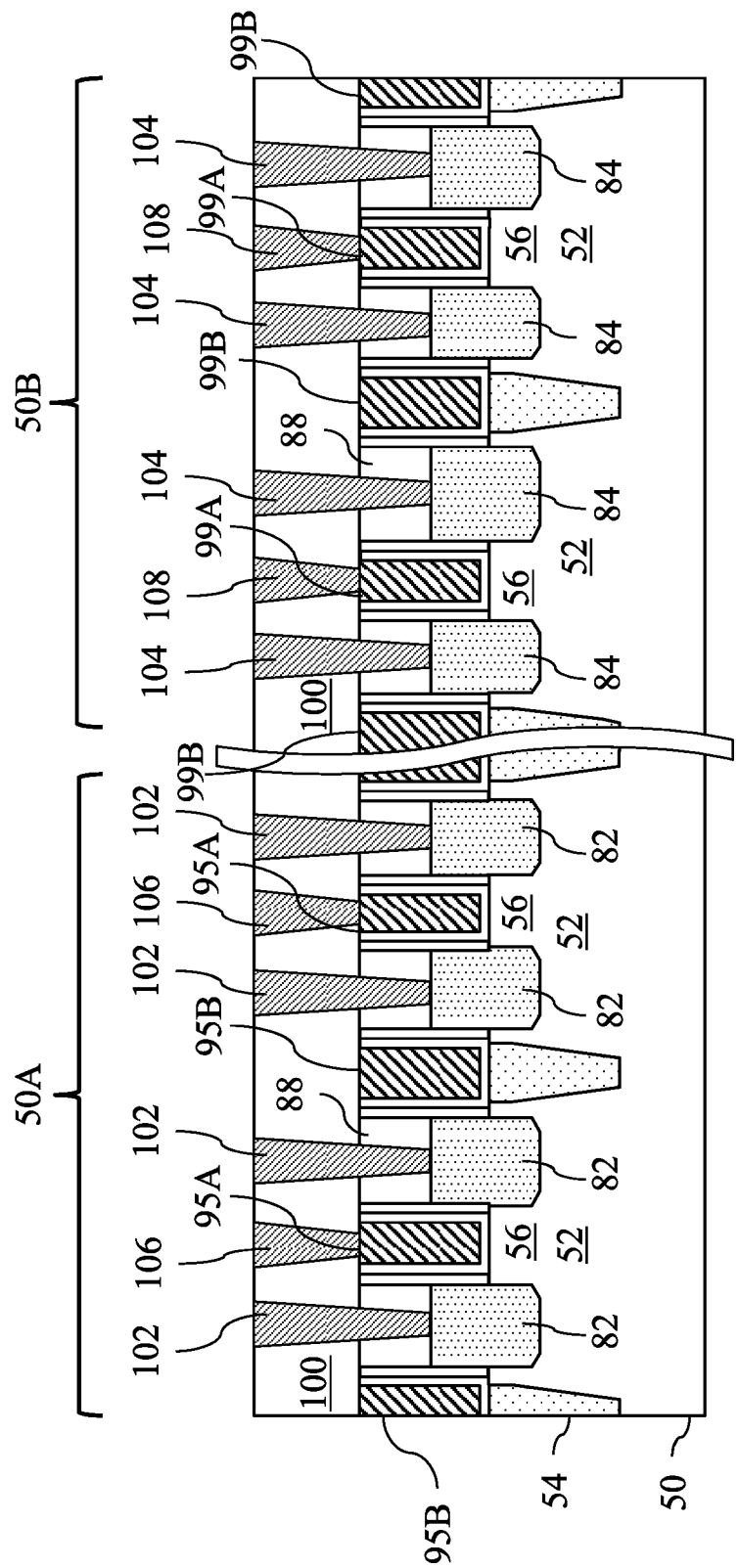

In FIGS. 19A and 19B, an ILD 100 is deposited over ILD 88. As further illustrated by FIGS. 19A and 19B, contacts 102 and 104 are formed through ILD 100 and ILD 88 and contacts 106 and 108 are formed through ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. Openings for contacts 106 and 108 are formed through the ILD 100. These openings may all be formed simultaneously in a same process, or in separate processes. For example, FIG. 19B illustrates contacts 102, 104, 106, and 108 in a single cross-section for ease of illustration. In other embodiments, contacts 102, 104, 106, and 108 may be disposed in different cross-sections. For example, a cross-section including contacts 102 and/or 104 may or may not include contacts 106 and/or 108.

The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between epitaxial source/drain regions 82 and 84 and contacts 102 and 104, respectively. Contacts 102 are physically and electrically coupled to the epitaxial source/drain regions 82, contacts 104 are physically and electrically coupled to the epitaxial source/drain regions 84, contacts 106 are physically and electrically coupled to the gate electrodes 94 of functional gate stacks 95A, and contacts 108 are physically and electrically coupled to the gate electrodes 98 of functional gate stacks 99A. Because epitaxial source/drain regions 82 and 84 are formed with fewer facets, a landing area (e.g., on epitaxial source/drain regions 82 and 84) having improved planarity may be provided for contacts 102 and 104, which reduces manufacturing defects. For example, compared to a landing area of contacts 208 on epitaxial source/drain regions 206 of FIG. 15C, a landing area of contacts 102 and 104 on respective epitaxial source/drain regions 82 and 84 is more planar and larger. Therefore, reliability and yield of the manufacturing process may be improved. Furthermore, due to the larger size of epitaxial source/drain regions 82 and 84 (e.g., compared to epitaxial source/drain regions 206 of FIG. 15C) formed using embodiment processes, electrical characteristics of the resulting FinFET devices can also be improved. The improved electrical characteristics may include reduced short channel effects, reduced leakage, lower parasitic capacitance, combinations thereof, and the like.

ILD 100 may cover an entire top surface of dummy gate stacks 95B and 99B, and no contacts may extend through ILD 100 to dummy gate stacks 95B and 99B. Thus, dummy gate stacks 95B and 99B may be electrically insulated from other conductive lines and/or vias in the resulting device. In other embodiments, contacts (e.g., similar to contacts 106 and/or 108) may also be formed in ILD 100 to electrically connect to gate electrodes of dummy gate stacks 95B and 99B.

Thus, as described above, recess may be patterned in a semiconductor fin between adjacent dummy gate stacks. The semiconductor fin may span an entire distance between the adjacent dummy gate stacks. The recess may be surrounded by a same material of the semiconductor fin in a top-down view of the device. Subsequently, source/drain epitaxial regions are formed in the recesses on the material of the semiconductor fin. Because the source/drain epitaxy is performed on a semiconductor material and surrounded on all sides by a same material, epitaxial source/drain regions may be formed having fewer facets, reduced defects, reduced, short channel effects, and the like.

In accordance with an embodiment, a method includes forming first dummy gate stack and a second dummy gate stack over a semiconductor fin. A portion of the semiconductor fin is exposed by an opening between the first dummy gate stack and the second dummy gate stack. The method further includes etching the portion of the semiconductor fin to extend the opening into the semiconductor fin. A material of the semiconductor fin surrounds the opening in a top-down view of the semiconductor fin. The method further includes epitaxially growing a source/drain region in the opening on the portion of the semiconductor fin.

In accordance with another embodiment, a method includes forming a first dummy gate stack over an isolation region between a first semiconductor fin and a second semiconductor fin. The first dummy gate stack extends from over a sidewall of the first semiconductor fin to over a sidewall of the second semiconductor fin, and a first line along a lengthwise dimension of the first semiconductor fin extends through the first semiconductor fin and the second semiconductor fin. The method further includes etching a first opening in the first semiconductor fin adjacent the first dummy gate stack, etching a second opening in the second semiconductor fin adjacent the first dummy gate stack, epitaxially growing a first source/drain region in the first opening on the first semiconductor fin, epitaxially growing a second source/drain region in the second opening on the second semiconductor fin, and replacing the first dummy gate stack with a first replacement gate stack.

In accordance with yet another embodiment, a device includes a first semiconductor fin extending upwards from a semiconductor substrate, a first gate stack over and extending along sidewalls of the first semiconductor fin in a first cross-section of the device, and a source/drain region adjacent the first gate stack. A material of the first semiconductor fin surrounds at least a bottom portion of the source/drain region in a top-down view of the device. The device further includes a first dielectric layer over the source/drain region, a first source/drain contact extending through the first dielectric layer and electrically connected to the source/drain region, a second dielectric layer over the first dielectric layer and the first gate stack, and a gate contact extending through the second dielectric layer and electrically connected to the first gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming first dummy gate stack and a second dummy gate stack over a semiconductor fin, wherein a portion of the semiconductor fin is exposed by an opening between the first dummy gate stack and the second dummy gate stack;
    etching the portion of the semiconductor fin to extend the opening into the semiconductor fin, wherein a material of the semiconductor fin surrounds the opening in a top-down view of the semiconductor fin; and
    epitaxially growing a source/drain region in the opening on the portion of the semiconductor fin.

2. The method of claim 1, wherein epitaxially growing the source/drain region comprises epitaxially growing the source/drain region along sidewalls of the first dummy gate stack and the second dummy gate stack.

3. The method of claim 1, wherein the first dummy gate stack further extends over an isolation region in a semiconductor substrate.

4. The method of claim 3, wherein the first dummy gate stack extends from the semiconductor fin to an additional semiconductor fin, wherein the isolation region is disposed between the semiconductor fin and the additional semiconductor fin.

5. The method of claim 1 further comprising a third dummy gate stack disposed on an opposing side of the second dummy gate stack as the first dummy gate stack, wherein a first sidewall of the semiconductor fin is disposed under the first dummy gate stack, and wherein a second sidewall of the semiconductor fin opposite the first sidewall is disposed under the third dummy gate stack.

6. The method of claim 1 further comprising:
    replacing the first dummy gate stack with a first replacement gate stack; and
    replacing the second dummy gate stack with a second replacement gate stack.

7. The method of claim 6, wherein the first replacement gate stack is a dummy gate stack, and wherein a dielectric layer covers an entire top surface of the first replacement gate stack after a gate contact is formed through the dielectric layer to electrically connect to the second replacement gate stack.

8. A method comprising:
forming a first dummy gate stack over an isolation region between a first semiconductor fin and a second semiconductor fin, wherein the first dummy gate stack extends from over a sidewall of the first semiconductor fin to over a sidewall of the second semiconductor fin, and wherein a first line along a lengthwise dimension of the first semiconductor fin extends through the first semiconductor fin and the second semiconductor fin;
etching a first opening in the first semiconductor fin adjacent the first dummy gate stack;
etching a second opening in the second semiconductor fin adjacent the first dummy gate stack;
epitaxially growing a first source/drain region in the first opening on the first semiconductor fin;
epitaxially growing a second source/drain region in the second opening on the second semiconductor fin; and
replacing the first dummy gate stack with a first replacement gate stack.

9. The method of claim 8, wherein a material of the first semiconductor fin completely surrounds the first opening in a top-down view of the first semiconductor fin.

10. The method of claim 8 further comprising:
forming a second dummy gate stack adjacent the first dummy gate stack on the first semiconductor fin;
after epitaxially growing the first source/drain region, replacing the second dummy gate stack with a second replacement gate stack;
depositing a first dielectric layer over the first replacement gate stack and the second replacement gate stack; and
forming a gate contact extending through the first dielectric layer and electrically connected to the second replacement gate stack.

11. The method of claim 8 further comprising:
forming a second dielectric layer over the first source/drain region and the second source/drain region;
forming a first source/drain contact through the second dielectric layer and electrically connected to the first source/drain region; and
forming a second source/drain contact through the second dielectric layer and electrically connected to the second source/drain region.

12. The method of claim 8, wherein the first dummy gate stack extends along sidewalls of the first semiconductor fin and the second semiconductor fin in a cross-sectional view taken along a second line perpendicular to the first line.

13. The method of claim 8 further comprising forming a spacer along a sidewall of the first dummy gate stack over the first semiconductor fin, wherein sidewalls of the first opening and the spacer are substantially aligned.

14. A method comprising:
forming a shallow trench isolation (STI) region between a first semiconductor fin and a second semiconductor fin;
depositing a dummy dielectric layer over the first semiconductor fin and the STI region;
depositing a dummy gate layer over the dummy dielectric layer;
patterning an opening extending through the dummy gate layer and dummy dielectric layer to expose a region of the first semiconductor fin, wherein after patterning the opening extending through the dummy gate layer and the dummy dielectric layer, first portions of the dummy dielectric layer and the dummy gate layer define a first dummy gate stack over the STI region;
extending the opening into the first semiconductor fin, wherein the opening is bounded on at least two sides by the first semiconductor fin in a top down view after extending the opening into the first semiconductor fin;
epitaxially growing a source/drain region over in the opening; and
after epitaxially growing the source/drain region, replacing the first dummy gate stack with a second dummy gate stack.

15. The method of claim 14, wherein the first dummy gate stack extends continuously from a sidewall of the first semiconductor fin to a sidewall of the second semiconductor fin.

16. The method of claim 15, wherein the first dummy gate stack is further disposed over the first semiconductor fin and the second semiconductor fin.

17. The method of claim 14, wherein the opening is bounded all sides by the first semiconductor fin in the top down view after extending the opening into the first semiconductor fin.

18. The method of claim 14, wherein after patterning the opening extending through the dummy gate layer and the dummy dielectric layer, second portions of the dummy dielectric layer and the dummy gate layer define a third dummy gate stack over the first semiconductor fin, wherein the method further comprises replacing the third dummy gate stack with a functional gate stack.

19. The method of claim 18, wherein the functional gate stack and the second dummy gate stack are formed simultaneously.

20. The method of claim 14 further comprising forming a spacer along a sidewall of the first dummy gate stack over the first semiconductor fin, wherein sidewalls of the opening and the spacer are substantially aligned.

* * * * *